US011699713B2

(12) United States Patent
Yang

(10) Patent No.: US 11,699,713 B2
(45) Date of Patent: Jul. 11, 2023

(54) PASSIVATION SCHEME FOR IMAGE SENSOR SUBSTRATE

(71) Applicant: Taiwan Semiconductor Manufacturing Co., Ltd., Hsinchu (TW)

(72) Inventor: Kai-Yun Yang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 99 days.

(21) Appl. No.: 17/340,458

(22) Filed: Jun. 7, 2021

(65) Prior Publication Data
US 2022/0285409 A1 Sep. 8, 2022

Related U.S. Application Data

(60) Provisional application No. 63/157,018, filed on Mar. 5, 2021.

(51) Int. Cl.
*H01L 27/146* (2006.01)
(52) U.S. Cl.
CPC .... *H01L 27/1463* (2013.01); *H01L 27/14643* (2013.01); *H01L 27/14692* (2013.01); *H01L 27/14698* (2013.01)
(58) Field of Classification Search
CPC .......... H01L 27/1463; H01L 27/14643; H01L 27/14692; H01L 27/14698; H01L 27/1462; H01L 27/1464; H01L 27/14645; H01L 27/14685; H01L 27/14689
See application file for complete search history.

(56) References Cited

U.S. PATENT DOCUMENTS

| 10,134,790 | B1 * | 11/2018 | Wu ..................... H01L 27/1462 |
| 10,334,191 | B1 | 6/2019 | Yang et al. |
| 11,329,086 | B2 * | 5/2022 | Liu .................... H01L 27/14621 |
| 2014/0353468 | A1 | 12/2014 | Choi et al. |
| 2016/0307945 | A1 | 10/2016 | Madurawe |
| 2020/0381464 | A1 | 12/2020 | Hong et al. |
| 2021/0399029 | A1 | 12/2021 | Ohura et al. |

OTHER PUBLICATIONS

Wu et al. "Correlative Study of Film Lifetime, Hydrogen Content, and Surface Passivation Quality of Amorphous Silicon Films on Silicon Wafers" IEEE Journal of Photovoltaics, vol. 10, No. 5, Sep. 2020.
Groner et al. "Low-Temperature Al2O3 Atomic Layer Deposition" Chem. Mater. 2004, 16, 639-645, published in 2004.
(Continued)

*Primary Examiner* — Seung C Sohn
(74) *Attorney, Agent, or Firm* — Eschweiler & Potashnik, LLC

(57) ABSTRACT

The present disclosure relates to an integrated chip including a substrate. A photodetector is arranged within the substrate. A trench isolation structure extends into the substrate on opposite sides of the photodetector. The trench isolation structure separates the photodetector from neighboring photodetectors. A first passivation layer is between a sidewall of the substrate and a sidewall of the trench isolation structure. The first passivation layer includes hydrogenated amorphous silicon.

20 Claims, 17 Drawing Sheets

(56) References Cited

OTHER PUBLICATIONS

Langford et al. "Infrared absorption strength and hydrogen content of hydrogenated amorphous silicon" Physical Review B, vol. 45, No. 23, published on Jun. 15, 1992.

Hoex et al. "Ultralow surface recombination of c-Si substrates passivatedby plasma-assisted atomic layer deposited Al2O3" Applied Physics Letters 89, 042112 (2006), published on Jul. 27, 2006.

Carlson, D. E. "The Doping of Hydrogenated Amorphous Silicon and Its Impact on Devices" Sold State and Materials Sciences, published in 1990.

Jan-Willem et al. "High quality crystalline silicon surface passivation by combined intrinsic and n-type hydrogenated amorphous silicon" Applied Physics Letters 99, 203503 (2011), published on Nov. 16, 2011.

Mallikarjuna et al. "Electronic Devices & Circuits" Malla Reddy College of Engineering & Technology, published Jun. 8, 2018.

Honsberg et al. "Surface Recombination" The date of publication is unknown. Retrieved online on Jun. 6, 2021 from https://www.pveducation.org/pvcdrom/pn-junctions/surface-recombination.

\* cited by examiner

PASSIVATION SCHEME FOR IMAGE SENSOR SUBSTRATE

REFERENCE TO RELATED APPLICATION

This Application claims the benefit of U.S. Provisional Application No. 63/157,018, filed on Mar. 5, 2021, the contents of which are hereby incorporated by reference in their entirety.

BACKGROUND

Integrated circuits (ICs) with image sensors are used in a wide range of modern day electronic devices, such as, for example, cameras and cell phones. In recent years, complementary metal-oxide-semiconductor (CMOS) image sensors have begun to see widespread use, largely replacing charge-coupled device (CCD) image sensors. Compared to CCD image sensors, CMOS image sensors are favored due to low power consumption, small size, fast data processing, a direct output of data, and low manufacturing cost. Some types of CMOS image sensors include frontside illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
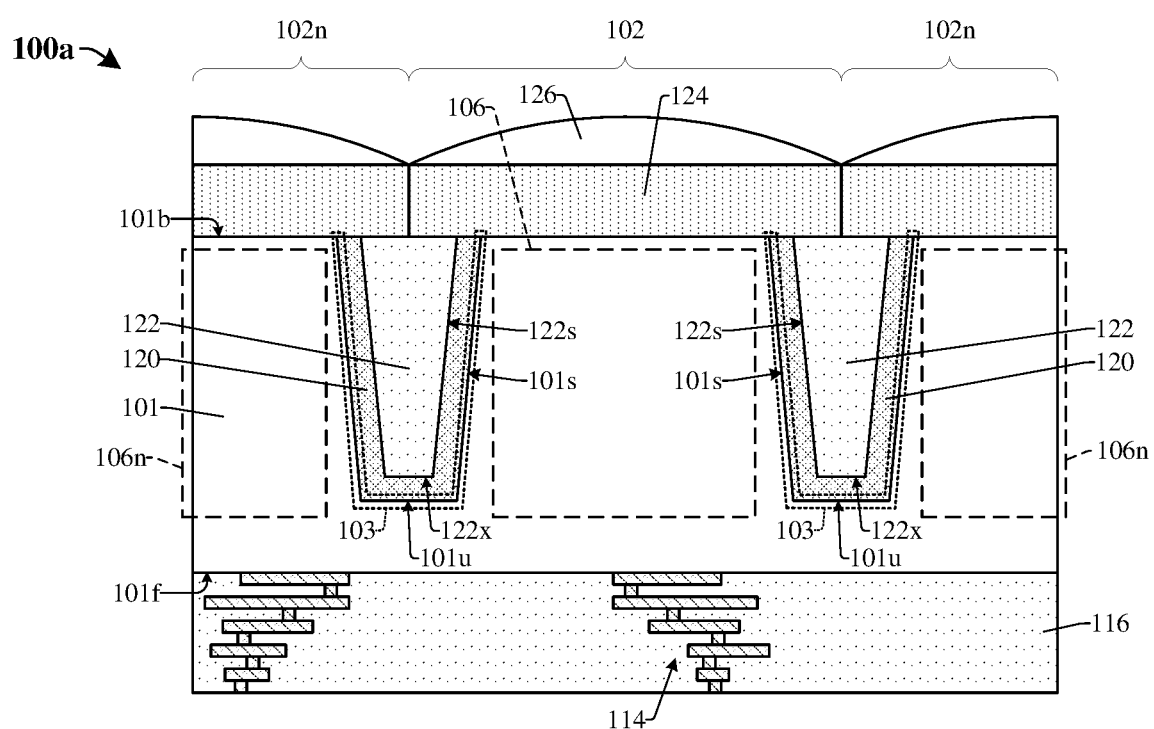
FIG. 1A illustrates a cross-sectional view of some embodiments of an image sensor comprising a passivation structure extending along a substrate on opposite sides of a photodetector.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some image sensors include a plurality of pixels along a substrate that are separated by a deep trench isolation (DTI) structure. For example, an image sensor includes a pixel along a substrate. The pixel comprises a photodetector in the substrate. The photodetector is separated from neighboring photodetectors of neighboring pixels by a DTI structure that extends into the substrate on opposite sides of the photodetector. A sidewall of the DTI structure extends along a sidewall of the substrate and faces the photodetector.

In some instances, photo-generated electron and hole recombination may be high along surfaces (e.g., sidewalls, upper surfaces, lower surfaces, etc.) of the substrate due to some defects (e.g., etching damage, dangling bonds, interface traps, etc.) that may exist along the surfaces. In some instances, when photo-generated electrons and holes recombine along a surface of the substrate (e.g., near the sidewall of the substrate that extends along the DTI), a performance (e.g., a white pixel performance) of the image sensor may be reduced. Thus, some image sensors include an aluminum oxide passivation layer along the substrate to passivate the substrate. For example, some image sensors include an aluminum oxide passivation layer along the sidewall of the substrate to passivate the sidewall of the substrate. In some image sensors, the aluminum oxide passivation layer is arranged on the sidewall of the substrate and separates the sidewall of the substrate from the sidewall of the DTI. Because aluminum oxide has a negative fixed charge, the aluminum oxide passivation layer forms an electron barrier along the sidewall of the substrate. The electron barrier may repel photo-generated electrons from the sidewall and hence may reduce recombination along the sidewall of the substrate. As a result, a performance of the image sensor may be improved.

However, a challenge with these image sensors is that the aluminum oxide passivation layer may not provide sufficient passivation along the sidewall of the substrate. For example, if the substrate has n-type doping along an interface between the substrate and the aluminum oxide passivation layer, a height of the electron barrier produced by the aluminum oxide passivation layer at the interface may be reduced. Thus, the ability of the aluminum oxide passivation layer to prevent photo-generated electrons from recombining near the interface may be reduced. As a result, a performance of image sensor may be reduced. In some instances, some image sensors may include a p-type semiconductor well that extends along the aluminum oxide passivation layer between the passivation layer and the n-type substrate to increase the height of the electron barrier forced by the aluminum oxide passivation layer at the interface with the p-type well. However, the p-type well may reduce a full well capacity (FWC) of the photodetector. Thus, a performance of the image sensor may be reduced.

Another challenge with the image sensor is that the aluminum oxide passivation layer may utilize a high temperature anneal in a hydrogen gas environment to provide hydrogen ions to the sidewall of the substrate to passivate dangling bonds that exist along the sidewall of the substrate and/or to passivate damage caused to the substrate by etching the substrate to form an opening for the DTI. However, subjecting the image sensor to such high temperatures may not be feasible for some image sensor fabrication processes. For example, in some instances, as pixel sizes of image sensors are reduced, a maximum temperature that the image sensors may withstand during fabrication may also be reduced. Thus, the high temperature anneal utilized for the aluminum oxide passivation layer to passivate the dangling bonds and/or damage along the substrate may not be feasible for some image sensor fabrication processes.

Various embodiments of the present disclosure are related to an image sensor comprising a substrate and one or more passivation layers along the substrate for improving a passivation of the substrate. The image sensor comprises a photodetector arranged within the substrate. A trench isolation structure extends into the substrate on opposite sides of the photodetector. The trench isolation structure separates the photodetector from neighboring photodetectors. A sidewall of the trench isolation structure extends along a sidewall of the substrate. A first passivation layer is between the sidewall of the substrate and the sidewall of the trench isolation structure. The first passivation layer comprises hydrogenated amorphous silicon. A dopant concentration and a hydrogen concentration of the hydrogenated amorphous silicon can be controlled when depositing the first passivation layer.

Because the dopant concentration of the hydrogenated amorphous silicon can be controlled, a height of an electron barrier produced by the first passivation layer along the sidewall of the substrate may be controlled (e.g., increased). Thus, a recombination of photogenerated electrons and holes along the sidewall may be reduced and hence a performance (e.g., a white pixel performance) of the image sensor may be improved.

Further, because the hydrogen concentration of the hydrogenated amorphous silicon can be controlled, the first passivation layer may be able to provide more hydrogen ions to the sidewall of the substrate to passivate defects (e.g., dangling bonds, interface traps, etching damage, etc.) along the sidewall of the substrate. Thus, a performance of the image sensor may be further improved. Furthermore, because the hydrogen concentration of the hydrogenated amorphous silicon can be controlled, a high temperature anneal may not be required to provide the hydrogen ions to the sidewalls of the substrate to passivate the defects along the sidewalls of the substrate. Thus, the first passivation layer may have an improved feasibility for some image sensors whose fabrication processes have limited heat exposure requirements.

FIG. 1A illustrates a cross-sectional view 100a of some embodiments of an image sensor comprising a passivation structure 120 extending along a substrate 101 on opposite sides of a photodetector 106.

The image sensor includes a pixel 102 along the substrate 101. The pixel 102 comprises a photodetector 106 arranged within in the substrate 101. An interconnect structure 114 is within a dielectric structure 116 along a frontside 101f of the substrate 101. A color filter 124 and a lens 126 (e.g., a micro-lens) extend along a backside 101b of the substrate 101 opposite the frontside 101f. Photons may enter the pixel 102 through the lens 126 and color filter 124.

A trench isolation structure 122 extends into the substrate 101 from the backside 101b of the substrate 101. The trench isolation structure 122 is on opposite sides of the photodetector 106 and separates the photodetector 106 from neighboring photodetectors 106n of neighboring pixels 102n along a boundary of the pixel 102. The trench isolation structure 122 may optically isolate the pixel 102 from neighboring pixels 102n. Sidewalls 122s of the trench isolation structure 122 extend along sidewalls 101s of the substrate 101.

A passivation structure 120 extends between and separates the trench isolation structure 122 from the substrate 101. For example, the passivation structure 120 extends between the sidewalls 122s of the trench isolation structure 122 and the sidewalls 101s of the substrate 101. In some embodiments, the passivation structure 120 is on the sidewalls 122s of the trench isolation structure 122 and on the sidewalls 101s of the substrate 101. In some embodiments, the passivation structure 120 also extends between lower surfaces 122x of the trench isolation structure 122 and upper surfaces 101u of the substrate 101. The passivation structure 120 abuts the substrate 101 along an interface 103. The passivation structure passivates the substrate 101 along the interface 103. For example, the passivation structure 120 passivates the sidewalls 101s of the substrate 101. The passivation structure 120 comprises one or more passivation layers. At least one of the one or more passivation layers of the passivation structure 120 comprises hydrogenated amorphous silicon.

The hydrogenated amorphous silicon is doped. For example, the hydrogenated amorphous silicon has p-type doping and the substrate 101 has n-type doping. Thus, the hydrogenated amorphous silicon forms an electron barrier along the interface 103 between the passivation structure 120 and the substrate 101 to passivate the substrate 101. For example, the electron barrier may repel photo-generated electrons from the interface 103. As a result, a recombination of photo-generated electrons and holes along the interface 103 may be reduced, and hence a performance (e.g., a white pixel performance) of the image sensor may be improved. Further, a dopant concentration of the hydrogenated amorphous silicon can be controlled when forming the passivation structure 120. Because the dopant concentration of the hydrogenated amorphous silicon can be controlled, a height of an electron barrier produced by the passivation structure 120 along the interface 103 may be controlled (e.g., increased). As a result, a passivation of the substrate may be further improved and hence a performance of the image sensor may be further improved.

In addition, hydrogen ions from the hydrogenated amorphous silicon may passivate defects (e.g., interface traps, dangling bonds, etching damage, etc.) along the interface 103 to further passivate the substrate 101. As a result, a recombination of photo-generated electrons and holes along the interface 103 may be further reduced, and hence the performance (e.g., a white pixel performance) of the image sensor may be further improved. Further, a hydrogen concentration of the hydrogenated amorphous silicon can be controlled when forming the passivation structure 120. Because the hydrogen concentration of the hydrogenated amorphous silicon can be controlled, the passivation structure 120 may be able to provide more hydrogen ions to the interface 103 to passivate any defects that may exist along the interface 103. As a result, a performance of the image sensor may be further improved.

Further, because the hydrogen concentration of the hydrogenated amorphous silicon can be controlled, a high temperature anneal may not be utilized to provide the hydrogen ions to the interface 103 to passivate the substrate 101. Thus, the passivation structure 120 may have an improved feasibility for some image sensor technologies having fabrication processes that require limited heat exposure.

In some embodiments, the substrate 101 comprises crystalline silicon or some other suitable semiconductor material. In some embodiments, the substrate 101 has n-type doping and one or more of the one or more passivation layers of the passivation structure 120 have p-type doping. In some other embodiments, the substrate 101 has p-type doping and one or more of the one or more passivation layers of the passivation structure 120 have heavily doped p-type doping (e.g., p+ doping).

In some embodiments, the trench isolation structure 122 comprises silicon dioxide, silicon nitride, or the like. Although the trench isolation structure 122 is illustrated in FIG. 1A as not extending completely through the substrate 101, it will be appreciated that in some alternative embodiments (not shown), the trench isolation structure 122 may alternatively extend through the substrate 101 (e.g., from the backside 101b to the frontside 101f) to the dielectric structure 116.

In some embodiments, the photodetector 106 may, for example, be or comprise a photodiode, an avalanche photodiode, a single-photon avalanche diode, or some other suitable photodetector.

In some embodiments, the interconnect structure 114 may, for example, comprise metal or conductive vias, and metal or conductive lines, bond pads, some other suitable interconnect, some capacitor devices, some logic devices, or the like. In some embodiments, the dielectric structure 116 may, for example, comprise one or more dielectric layers, one or more etch-stop layers, or the like.

Although the image sensor illustrated in FIG. 1A is backside illuminated (BSI), it will be appreciated that in some alternative embodiments (not shown), the image sensor may alternatively be fronded illuminated (FSI). In some embodiments, the image sensor may be included in an integrated chip.

Figure 1B:
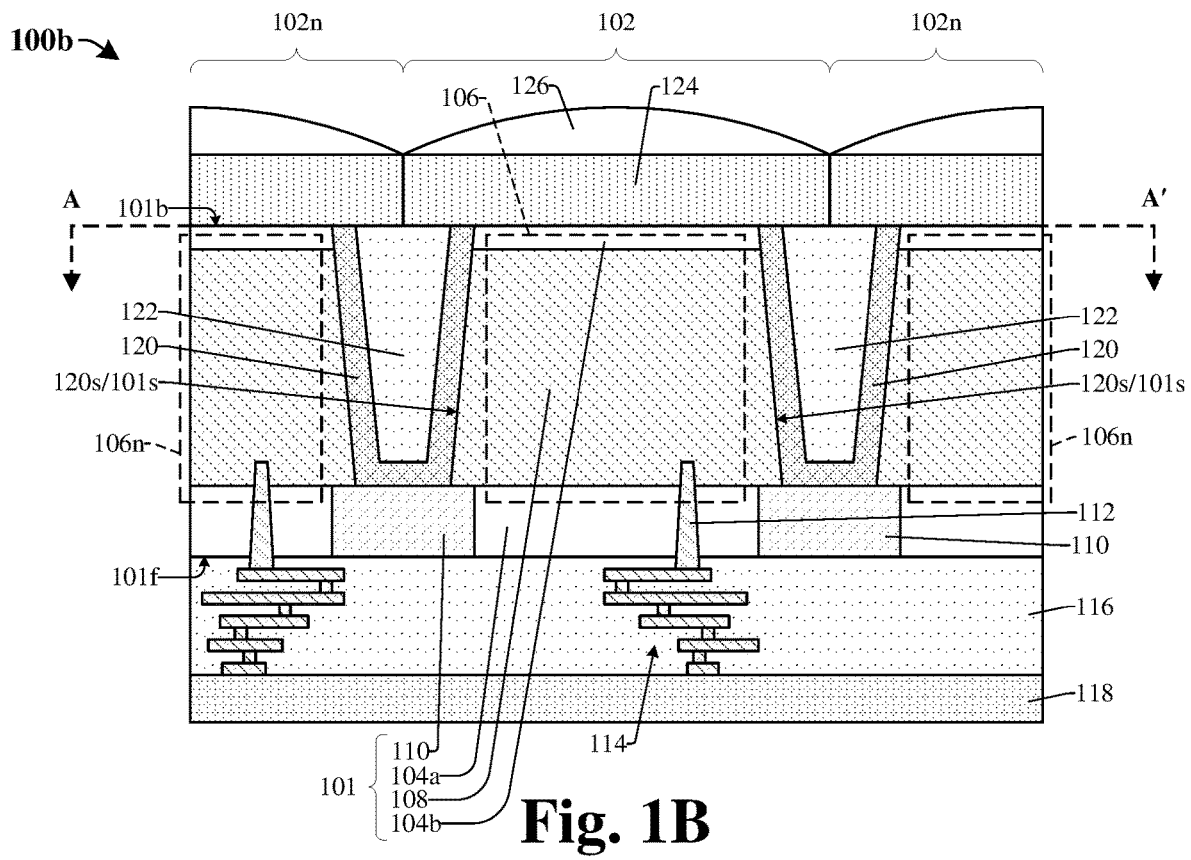
FIG. 1B illustrates a cross-sectional view of some embodiments of the image sensor of FIG. 1A in which a first semiconductor well and a second semiconductor well are within the substrate.

FIG. 1B illustrates a cross-sectional view 100b of some embodiments of the image sensor of FIG. 1A in which a first semiconductor well 108 and a second semiconductor well 110 are within the substrate 101. The cross-sectional view 100b of FIG. 1B may, for example, be taken across line A-A' of FIG. 2.

The first semiconductor well 108 of the substrate 101 is disposed between a first region 104a of the substrate 101 and a second region 104b of the substrate 101. The first semiconductor well 108 extends continuously between opposing sidewalls 120s of the passivation structure 120. For example, the first semiconductor well 108 extends continuously from a first sidewall of the passivation structure to a second sidewall opposite the first sidewall of the passivation structure 120. In some embodiments, sidewalls 101s of the substrate 101 (e.g., sides of the first semiconductor well 108 and sides of the second region 104b of the substrate 101) are on the sidewalls 120s of the passivation structure 120.

The second semiconductor well 110 of the substrate 101 is arranged directly under the trench isolation structure 122 and the passivation structure 120. The second semiconductor well 110 is arranged along the boundary of the pixel 102 and may electrically isolate the pixel 102 from the neighboring pixels 102n. In some embodiments, a top of the second semiconductor well 110 abuts a bottom of the first semiconductor well 108. In some embodiments, the passivation structure 120 is on a top of the second semiconductor well 110. In some other embodiments (not shown), the first region 104a of the substrate 101 may extend between the passivation structure 120 and the top of the second semiconductor well 110. In some embodiments, the second semiconductor well 110 extends along the frontside 101f of the substrate 101 (e.g., along the dielectric structure 116).

The first region 104a of the substrate 101 is directly below the first semiconductor well 108 and extends between a first segment of the second semiconductor well 110 and a second segment of the second semiconductor well 110. The second region 104b of the substrate 101 is directly above the first semiconductor well 108 and extends between sidewalls 120s of the passivation structure 120. For example, the second region 104b extends continuously from a first sidewall of the passivation structure to a second sidewall opposite the first sidewall of the passivation structure 120.

The first semiconductor well 108 and the second semiconductor well 110 are doped regions of the substrate 101 (e.g., doped regions of a crystalline silicon substrate). For example, the first semiconductor well 108 may have a first doping type (e.g., n-type), the second semiconductor well 110 may have a second doping type (e.g., p-type) opposite the first doping type, the first region 104a of the substrate 101 may have the second doping type (e.g., p-type), and the second region 104b of the substrate 101 may have the second doping type (e.g., p-type), or vice versa. In some embodiments, in addition to controlling a dopant concentration of the hydrogenated amorphous silicon of the passivation structure 120, a dopant concentration of the first semiconductor well 108 may also be controlled. As a result, a height of an electron barrier formed at the interface between the passivation structure 120 and the first semiconductor well 108 may be further increased and hence a performance of the image sensor may be further improved.

In some embodiments, the first semiconductor well 108, the first region 104a of the substrate 101, and the second region 104b of the substrate 101 form the photodetector 106. For example, the first semiconductor well 108 and the second region 104b of substrate 101 may form a photodiode (e.g., a p-n junction) along the backside 101b of the substrate 101. Additionally, or alternatively, the first semiconductor well 108 and the first region 104a of substrate 101 may form a photodiode (e.g., a p-n junction) along the frontside 101f of the substrate 101.

In some embodiments, a transfer gate 112 extends into substrate 101 from the frontside 101f of the substrate 101. For example, the transfer gate 112 extends from within the dielectric structure 116 through the first region 104a of the substrate 101 and into the first semiconductor well 108. The transfer gate 112 is coupled to interconnect structure 114. Although FIG. 1B illustrates the transfer gate 112 as extending vertically into the substrate 101, it will be appreciated that in some alternative embodiments, the transfer gate may not extend into the substrate 101, and may instead extend along the frontside 101f of the substrate within the dielectric structure 116. In some embodiments, a carrier wafer 118 may be arranged below the interconnect structure 114.

Figure 2:
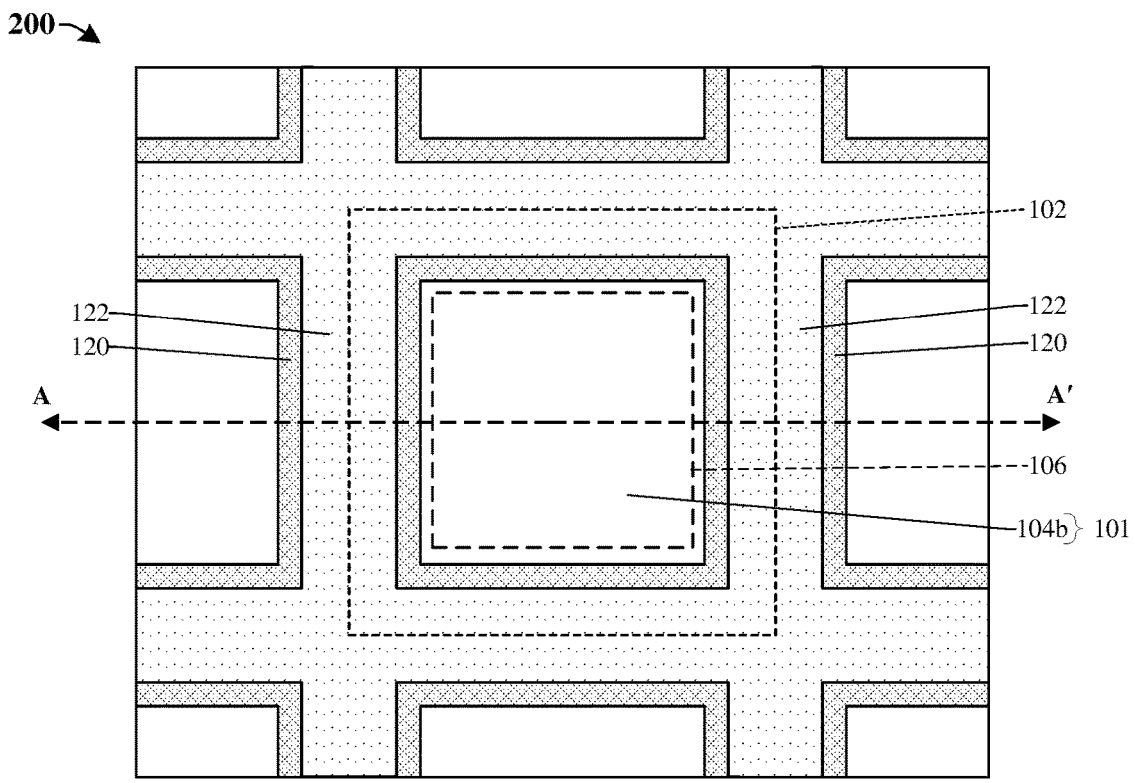
FIG. 2 illustrates a top view of some embodiments of the image sensor of FIG. 1B.

FIG. 2 illustrates a top view 200 of some embodiments of the image sensor of FIG. 1B.

The trench isolation structure 122 surrounds the photodetector 106 along a boundary of the pixel 102. The trench isolation structure 122 may also surround a plurality of other pixels and may have a grid-like top layout. The passivation structure 120 lines the trench isolation structure 122 and separates trench isolation structure 122 from the substrate 101 (e.g., from the second region 104b of the substrate 101 and/or from the first semiconductor well 108 of the substrate 101). Although the second semiconductor well (e.g., 110 of FIG. 1B) is not shown in FIG. 2, in some embodiments, the second semiconductor well may surround the pixel 102 along the boundary of the pixel 102. Further, in some embodiments, the second semiconductor well may also surround the plurality of other pixels and may also have a grid-like layout (e.g., similar to that of the trench isolation structure 122).

Figure 3:
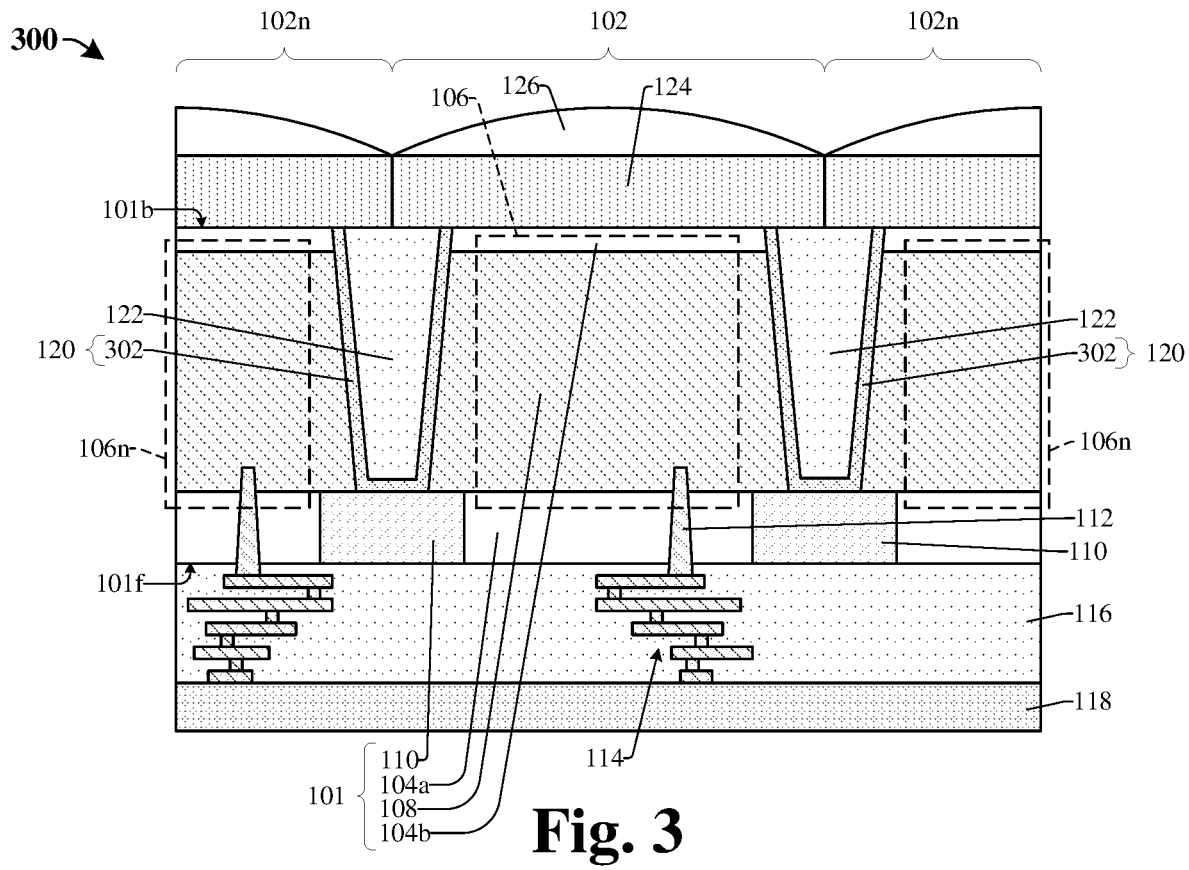
FIG. 3 illustrates a cross-sectional view of some embodiments of the image sensor of FIG. 1B in which the passivation structure comprises a first passivation layer.

FIG. 3 illustrates a cross-sectional view 300 of some embodiments of the image sensor of FIG. 1B in which the passivation structure 120 comprises a first passivation layer 302.

The first passivation layer 302 is between sidewalls of the substrate 101 and sidewalls of the trench isolation structure 122. In some embodiments, the first passivation layer 302 is on (e.g., in contact with) sidewalls of the substrate 101 (e.g., sides of the first semiconductor well 108 and sides of the second region 104b of the substrate 101). In other words, the first semiconductor well 108 and the second region 104b of the substrate 101 are on sidewalls of the first passivation layer 302. In some embodiments, the first passivation layer 302 is on sidewalls of the trench isolation structure 122. In some embodiments, the first passivation layer 302 is on an upper surface of the substrate 101 (e.g., a top of the second semiconductor well 110) and on a lower surface of the trench isolation structure 122.

The first passivation layer comprises hydrogenated amorphous silicon. In some embodiments, the first passivation layer 302 has p-type doping. For example, in some embodiments where the first semiconductor well 108 has n-type doping, the first passivation layer 302 has p-type doping. Further, in some embodiments where the first semiconductor well 108 has p-type doping, the first passivation layer 302 has heavily doped p-type doping (e.g., p+ doping). In other words, in embodiments where the first semiconductor well 108 has p-type doping and the first passivation layer 302 has p-type doping, a p-type dopant concentration of the first passivation layer 302 is greater than a p-type dopant concentration of the first semiconductor well 108.

A dopant concentration (e.g., a p-type dopant concentration) of the hydrogenated amorphous silicon of the first passivation layer 302 can be controlled. In some embodiments, a dopant concentration of the hydrogenated amorphous silicon of the first passivation layer 302 is between $10^{14}$ cm$^{-3}$ and $10^{21}$ cm$^{-3}$. In some embodiments, the hydrogenated amorphous silicon of the first passivation layer 302 may be doped with boron, aluminum, gallium, some other suitable dopant, or a combination of the forgoing.

Further, a hydrogen concentration of the hydrogenated amorphous silicon of the first passivation layer 302 can be controlled. In some embodiments, a hydrogen concentration of the hydrogenated amorphous silicon of the first passivation layer 302 is between 4% and 35%. In some embodiments, the first passivation layer 302 may have a thickness of 1 angstrom to 50 nanometers, 5 nanometers to 50 nanometers, or some other suitable thickness.

Figure 4:
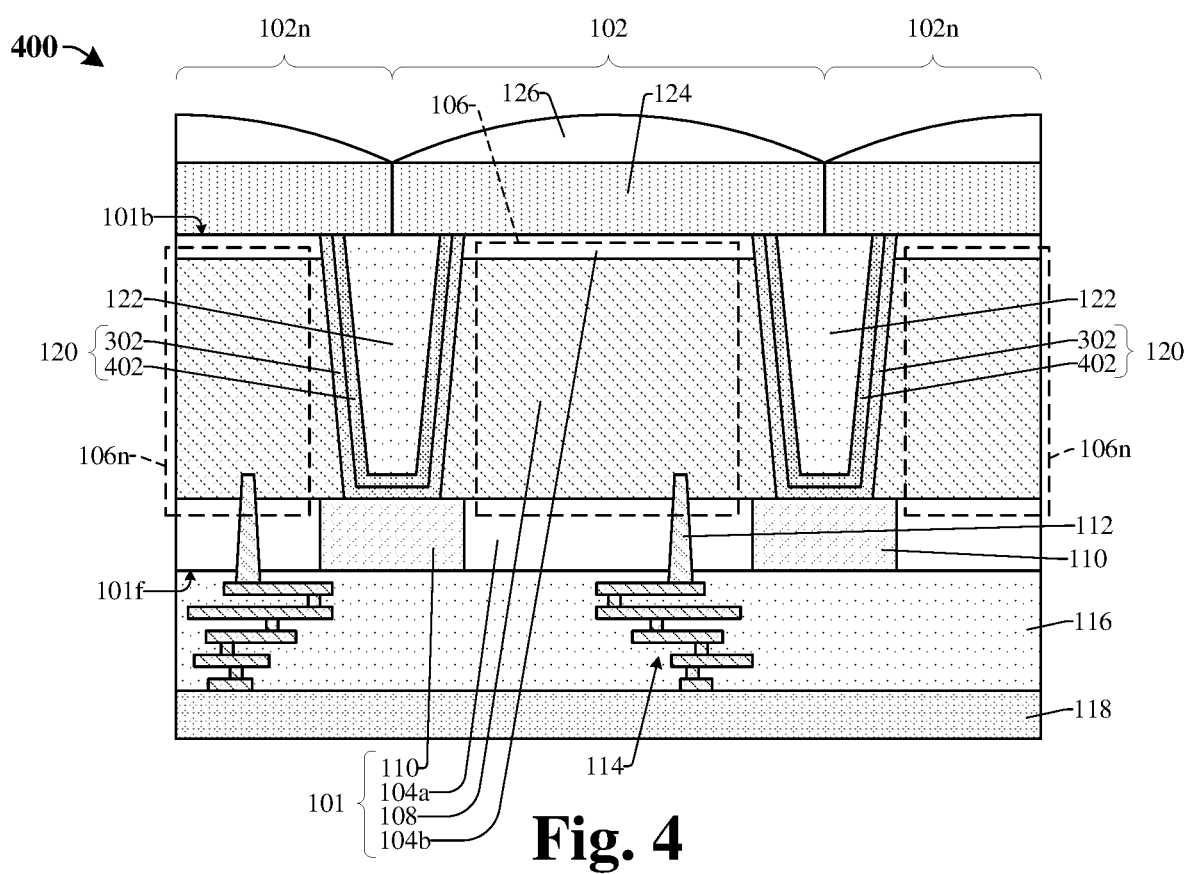
FIG. 4 illustrates a cross-sectional view of some embodiments of the image sensor of FIG. 1B in which the passivation structure comprises a first passivation layer and a second passivation layer.

FIG. 4 illustrates a cross-sectional view 400 of some embodiments of the image sensor of FIG. 1B in which the passivation structure 120 comprises a first passivation layer 302 and a second passivation layer 402.

The second passivation layer 402 is over the first passivation layer 302. The second passivation layer 402 is between the first passivation layer 302 and the trench isolation structure 122, and the first passivation layer 302 is between the second passivation layer 402 and the first semiconductor well 108 of the substrate 101. In some embodiments, the second passivation layer 402 is on sidewalls of the first passivation layer 302, on an upper surface of the first passivation layer 302, on a lower surface of the trench isolation structure 122, and on sidewalls of the trench isolation structure 122.

In some embodiments, the first passivation layer 302 comprises undoped hydrogenated amorphous silicon (e.g., intrinsic hydrogenated amorphous silicon) and the second passivation layer 402 comprises p-type hydrogenated amorphous silicon. In some embodiments where the first semiconductor well 108 has p-type doping, the first passivation layer 302 is undoped and the second passivation layer comprises has heavily doped p-type doping (e.g., p+ doping). In other words, in embodiments where the first semiconductor well 108 has p-type doping, a p-type dopant concentration of the second passivation layer 402 is greater than a p-type dopant concentration of the first semiconductor well 108.

In some instances, the first passivation layer 302 is undoped because the intrinsic hydrogenated amorphous silicon may passivate the substrate 101 better than doped intrinsic hydrogenated amorphous silicon. For example, in some instances, intrinsic hydrogenated amorphous silicon can reduce interface defects along substrate 101 to a greater degree than can doped hydrogenated amorphous silicon.

A dopant concentration (e.g., a p-type dopant concentration) of the hydrogenated amorphous silicon of the second passivation layer 402 can be controlled. In some embodiments, a dopant concentration of the hydrogenated amorphous silicon of the second passivation layer 402 is between $10^{14}$ cm$^{-3}$ and $10^{21}$ cm$^{-3}$. In some embodiments, the hydrogenated amorphous silicon of the second passivation layer 402 may be doped with boron, aluminum, gallium, some other suitable dopant, or a combination of the forgoing.

Further, a hydrogen concentration of the hydrogenated amorphous silicon of the second passivation layer 402 can be controlled. In some embodiments, a hydrogen concentration of the hydrogenated amorphous silicon of the second passivation layer 402 is between 4% and 35%. In some embodiments, the hydrogen concentration of the second passivation layer 402 may be different from the hydrogen concentration of the first passivation layer 302. In some embodiments, the second passivation layer 402 may have a thickness of 1 angstrom to 50 nanometers, 5 nanometers to 50 nanometers, or some other suitable thickness.

In some alternative embodiments, the first passivation layer 302 comprises p-type hydrogenated amorphous silicon and the second passivation layer 402 comprises aluminum oxide. In some instances, because aluminum oxide has a relatively high density, it may help prevent hydrogen from escaping the first passivation layer 302, thereby improving a passivation capability of the first passivation layer 302. Further, in some instances, because aluminum oxide has a fixed negative charge, it may further increase a height of an electron barrier along the interface between the substrate 101 and the passivation structure 120, thereby improving a passivation of the substrate 101. In some embodiments, a native oxide layer (not shown) comprising silicon dioxide may exist between the hydrogenated amorphous silicon of the first passivation layer 302 and the aluminum oxide of the second passivation layer 402.

Figure 5:
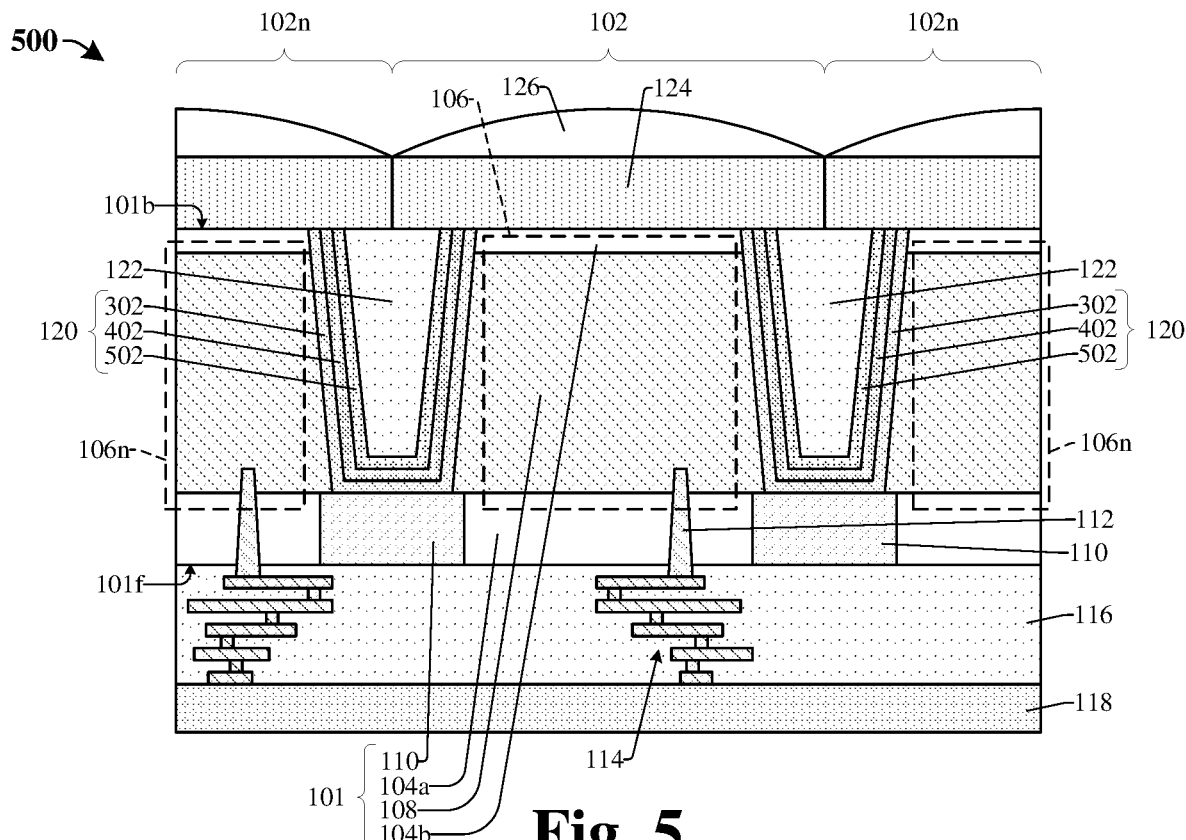
FIG. 5 illustrates a cross-sectional view of some embodiments of the image sensor of FIG. 1B in which the passivation structure comprises a first passivation layer, a second passivation layer, and a third passivation layer.

FIG. 5 illustrates a cross-sectional view 500 of some embodiments of the image sensor of FIG. 1B in which the passivation structure 120 comprises a first passivation layer 302, a second passivation layer 402, and a third passivation layer 502.

The third passivation layer 502 is over the second passivation layer 402. The third passivation layer 502 is between the second passivation layer 402 and the trench isolation structure 122, the second passivation layer 402 is between the first passivation layer 302 and the third passivation layer 502, and the first passivation layer 302 is between the second passivation layer 402 and the first semiconductor well 108 of the substrate 101. In some embodiments, the third passivation layer 502 is on sidewalls of the second passivation layer 402, on an upper surface of the second passivation layer 402, on a lower surface of the trench isolation structure 122, and on sidewalls of the trench isolation structure 122.

The first passivation layer 302 and the second passivation layer 402 both comprise hydrogenated amorphous silicon and the third passivation layer 502 comprises aluminum oxide. As previously discussed, including aluminum oxide in the passivation structure 120 may improve a passivation of the substrate 101. In some embodiments, the first passivation layer 302 is undoped (e.g., intrinsic hydrogenated amorphous silicon) and the second passivation layer 402 has p-type doping. In some embodiments, a native oxide layer (not shown) comprising silicon dioxide may exist between the hydrogenated amorphous silicon of the second passivation layer 402 and the aluminum oxide of the third passivation layer 502. In some embodiments, the third passivation layer 502 may have a thickness of 1 angstrom to 50 nanometers, 5 nanometers to 50 nanometers, or some other suitable thickness.

Figure 6:
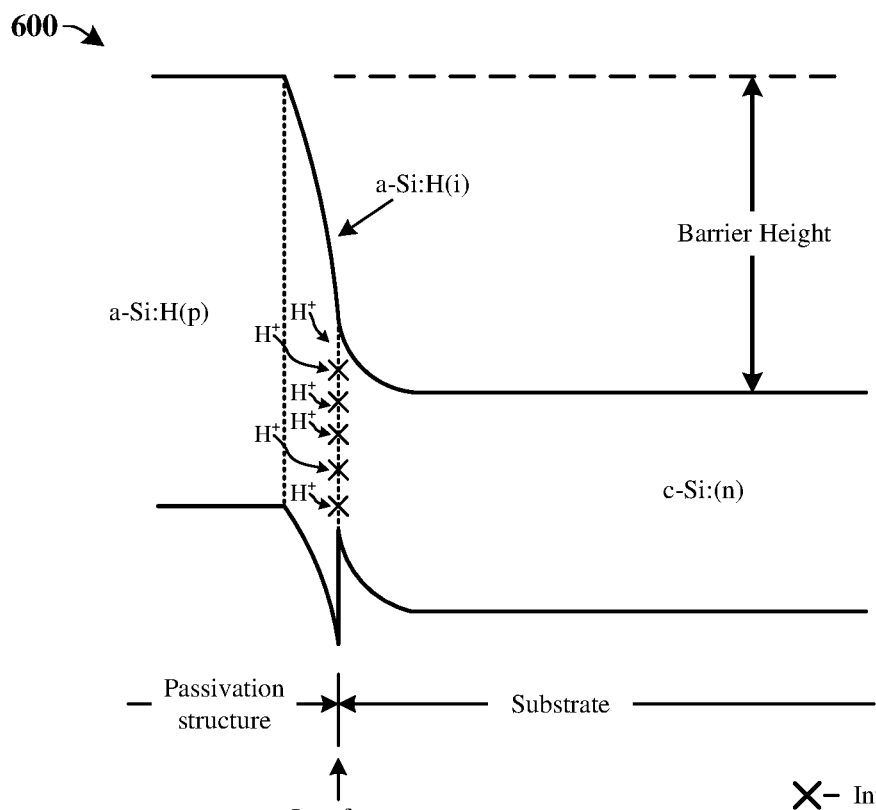
FIG. 6 illustrates a band diagram of some embodiments of an interface between a substrate and a passivation structure.

FIG. 6 illustrates a band diagram 600 of some embodiments of an interface (e.g., 103 of FIG. 1A) between a substrate (e.g., 101 of FIG. 1A or 108 of FIG. 1B) and a passivation structure (e.g., 120 of FIG. 1A or FIG. 1B).

The passivation structure comprises p-type hydrogenated amorphous silicon and intrinsic hydrogenated amorphous silicon, and the substrate comprises n-type crystalline silicon. The passivation structure forms an electron barrier at the interface with the substrate. A barrier height of the electron barrier may be proportional to a dopant concentration of the p-type hydrogenated amorphous silicon of the passivation structure. The electron barrier may correspond to a built-in electric field which may repel photogenerated electrons away from the interface. As a result, a recombination of photogenerated electrons and holes along the interface may be reduced, and hence a performance of the image sensor may be improved.

Further, as shown by FIG. 6, hydrogen ions from the passivation structure may passivate interface defects or near-interface defects that may exist along the interface. As a result, a passivation of the interface may be improved and hence a performance of the image sensor may be improved.

Figure 7:
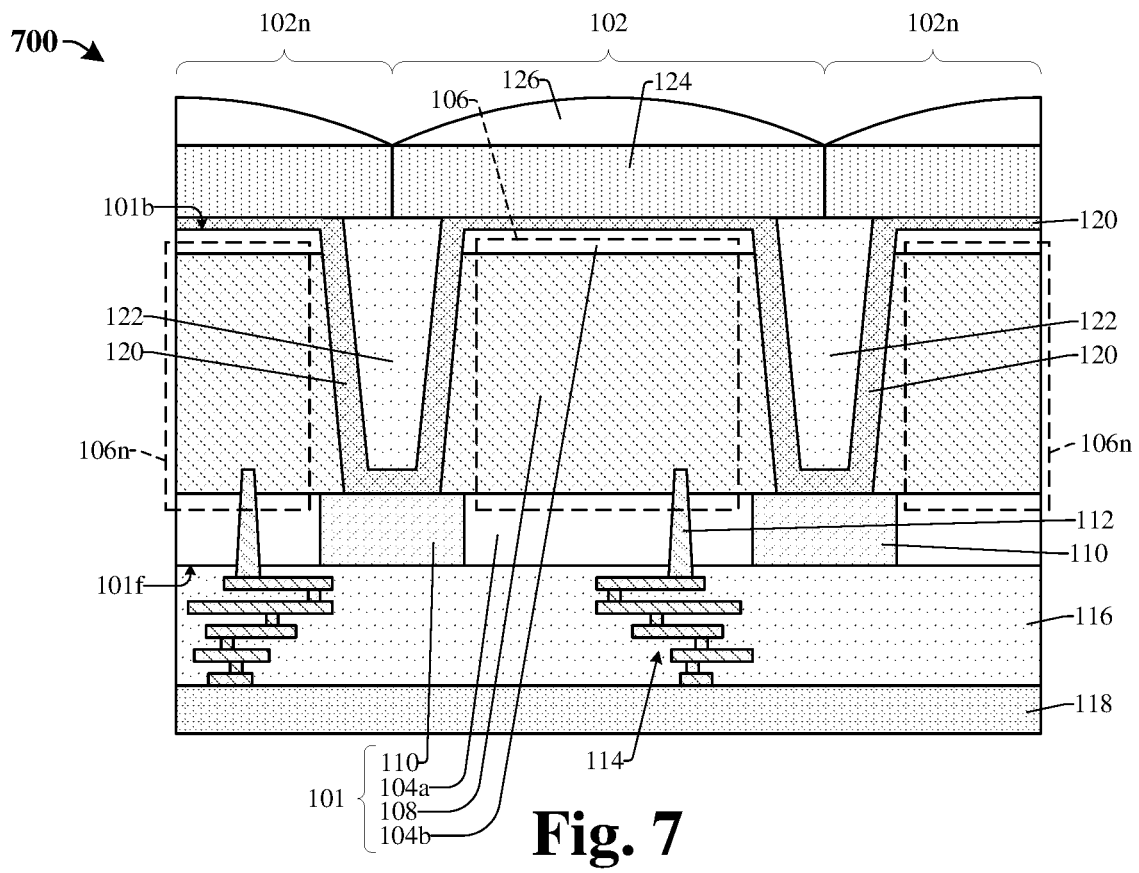
FIG. 7 illustrates a cross-sectional view of some embodiments of the image sensor of FIG. 1B in which the passivation structure extends over the photodetector.

FIG. 7 illustrates a cross-sectional view 700 of some embodiments of the image sensor of FIG. 1B in which the passivation structure 120 extends over the photodetector 106.

The passivation structure 120 (e.g., the first passivation layer 302 of the passivation structure 120) is on and extends along the backside 101b of the substrate 101 over the photodetector 106. Thus, the passivation structure 120 may passivate the backside 101b of the substrate 101, thereby improving a performance of the image sensor. In some embodiments, a thickness of the passivation structure 120 may be low along the backside 101b of the substrate 101. For example, a thickness of the passivation structure 120 may be lower along the backside 101b of the substrate 101 than along the sidewalls of the first semiconductor well 108 of the substrate 101. As a result, the passivation structure 120 may passivate the backside 101b of the substrate 101 without reflecting incoming photons away from the substrate 101 (i.e., without negatively affecting a performance of the image sensor).

Figure 20:
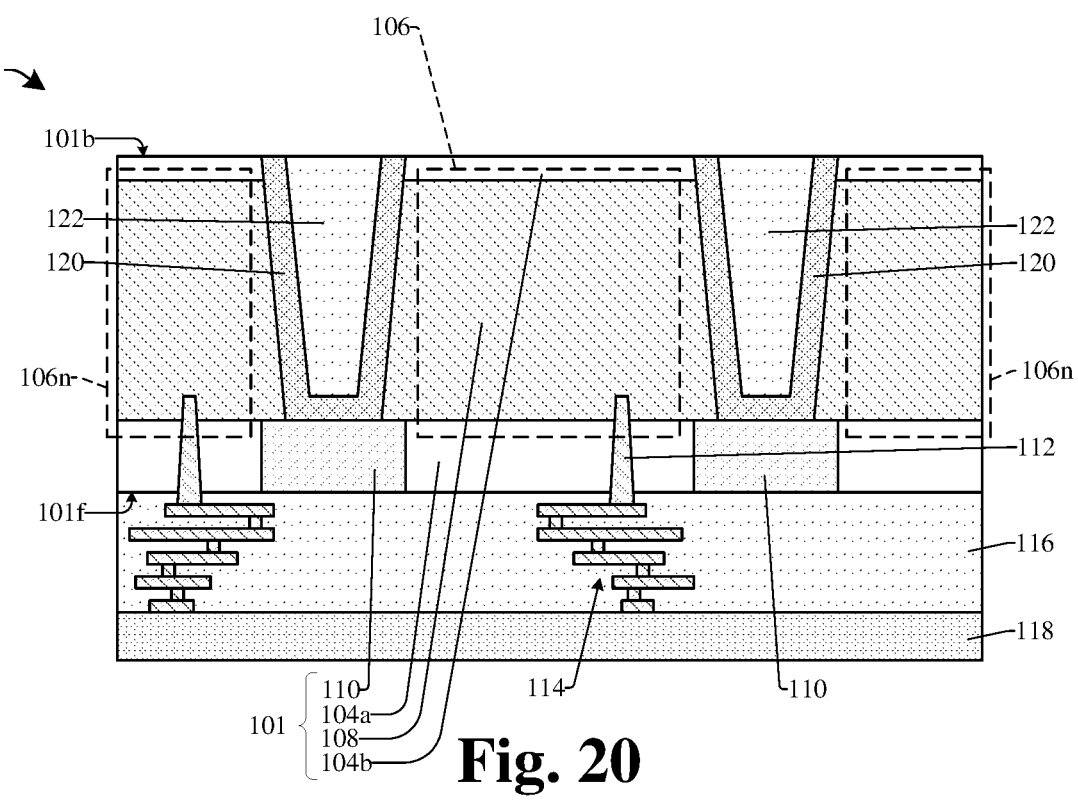

In some embodiments, the passivation structure 120 extends along the backside 101b of the substrate 101 and over the photodetector 106 due to a planarization process (e.g., as illustrated by FIG. 20) performed on the passivation structure 120 not removing the entirety of the passivation structure 120 from the backside 101b of the substrate 101.

Figure 8:
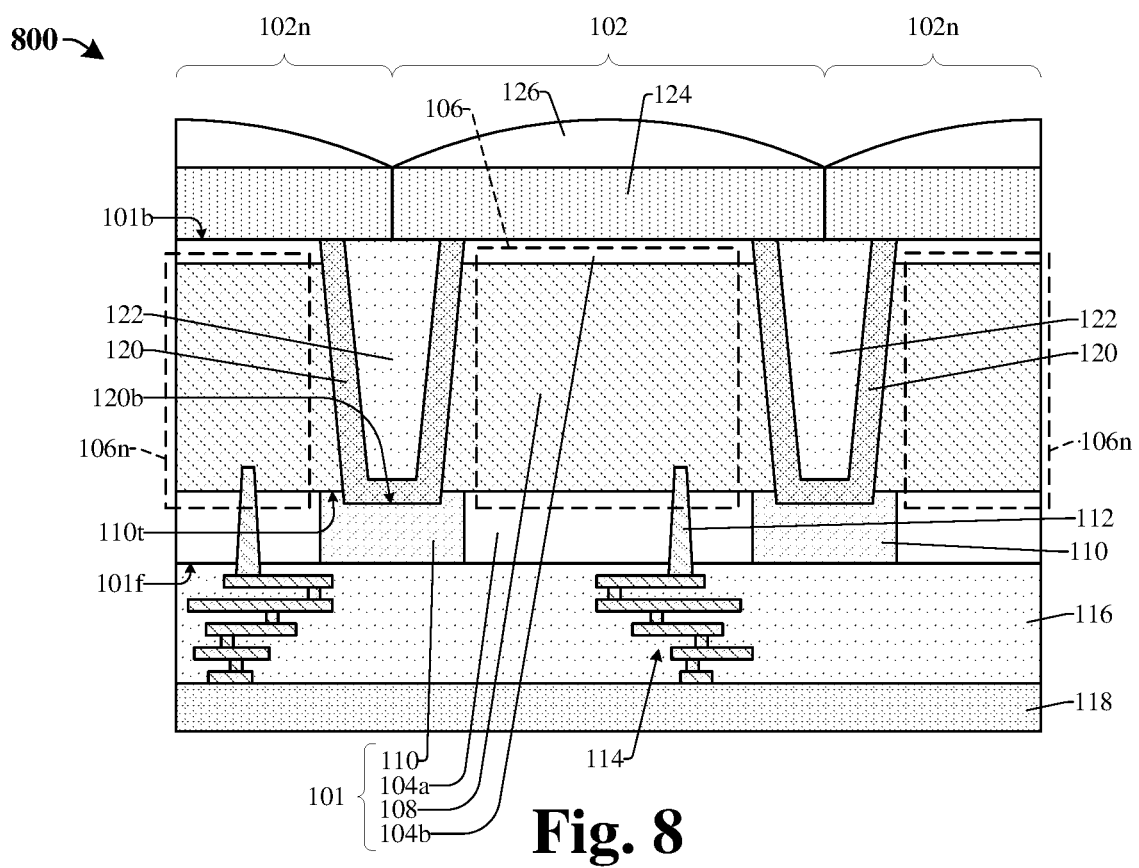
FIG. 8 illustrates a cross-sectional view of some embodiments of the image sensor of FIG. 1B in which the passivation structure extends into the second semiconductor well of the substrate.

FIG. 8 illustrates a cross-sectional view 800 of some embodiments of the image sensor of FIG. 1B in which the passivation structure 120 extends into the second semiconductor well 110 of the substrate 101.

A bottom surface 120b of the passivation structure 120 (e.g., a bottom surface of the first passivation layer 302 of the passivation structure 120) is below a top 110t of the second semiconductor well 110, and the second semiconductor well 110 extends along a sidewall of the passivation structure 120. In some embodiments, the passivation structure 120 extends into the second semiconductor well 110 due to an etch that forms a trench (e.g., 1604 of FIG. 16 or 2304 of FIG. 23) in the substrate 101 extending into the second semiconductor well 110 and due to subsequently forming the passivation structure 120 in the trench.

Figure 9:
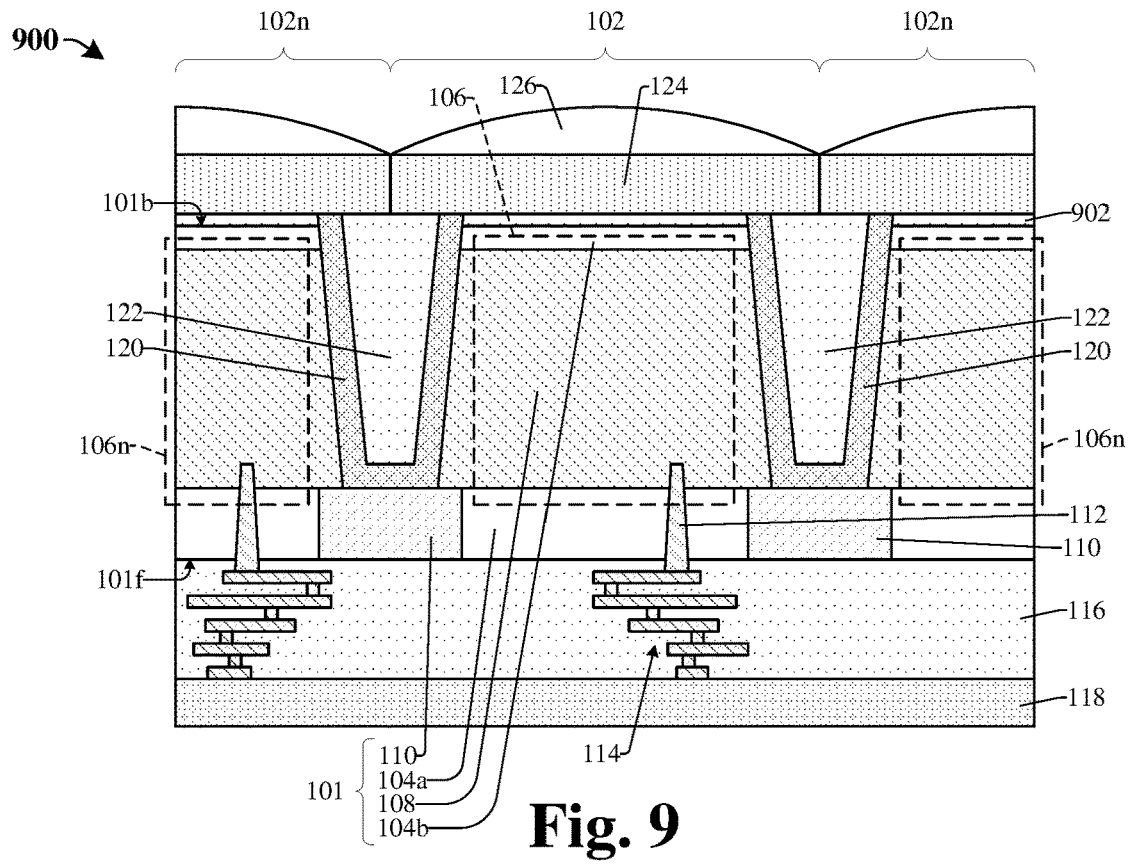
FIG. 9 illustrates a cross-sectional view of some embodiments of the image sensor of FIG. 1B in which a dielectric layer extends over the photodetector.

FIG. 9 illustrates a cross-sectional view 900 of some embodiments of the image sensor of FIG. 1B in which a dielectric layer 902 extends over the photodetector 106.

Figure 26:
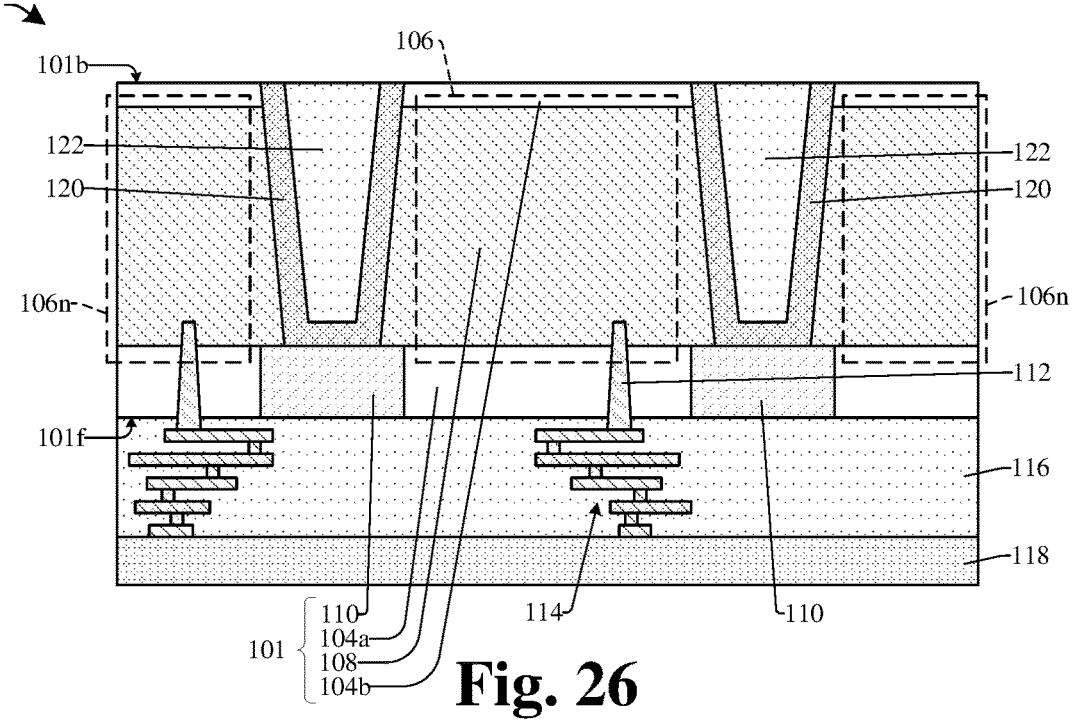

The dielectric layer 902 is on and extends along the backside 101b of the substrate 101 over the photodetector 106. The dielectric layer 902 extends continuously between sidewalls of the passivation structure 120. In some embodiments, the dielectric layer 902 may, for example, comprise silicon dioxide, silicon nitride, or some other suitable dielectric. In some embodiments, the dielectric layer 902 extends along the backside 101b of the substrate 101 over the photodetector 106 due to a planarization process (e.g., as illustrated by FIG. 26) performed on the dielectric layer 902 not removing the entirety of the dielectric layer 902 from the backside 101b of the substrate 101.

Figure 10:
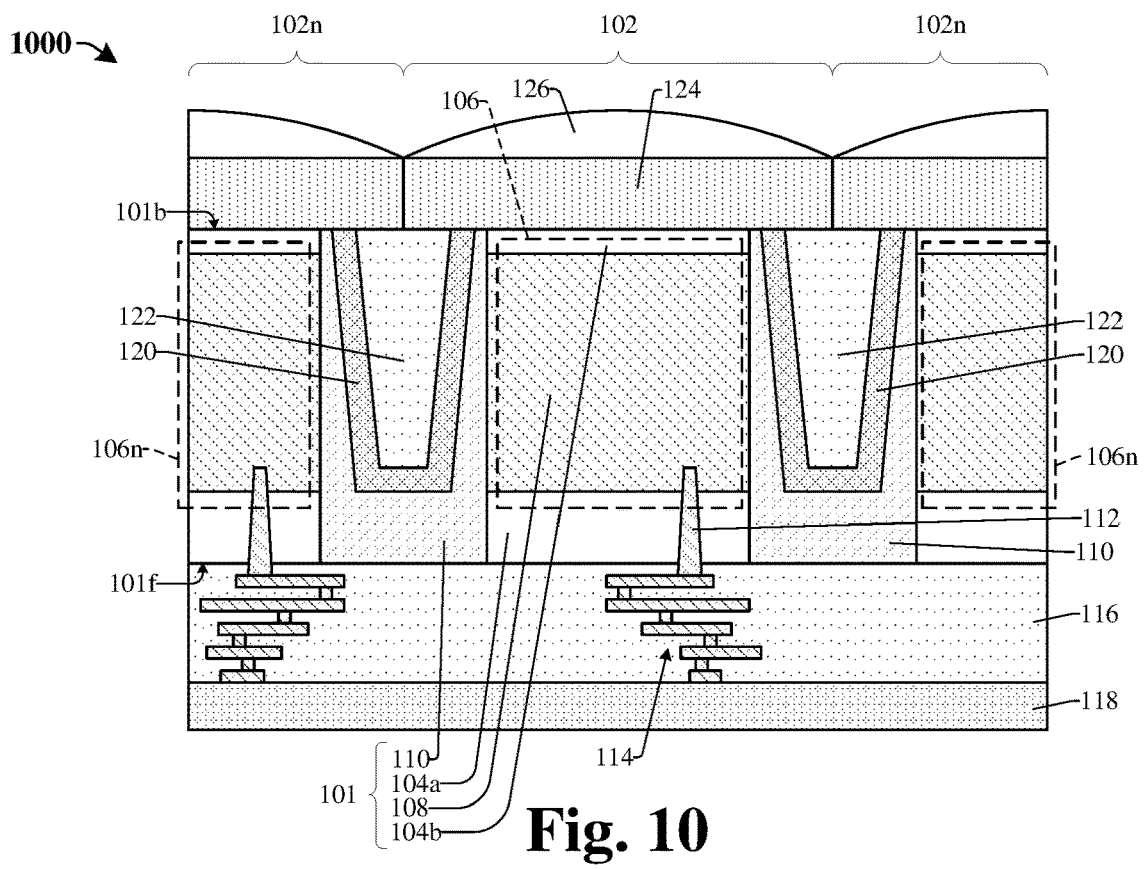
FIG. 10 illustrates a cross-sectional view of some embodiments of the image sensor of FIG. 1B in which the second semiconductor well extends through the substrate along sidewalls of the passivation structure.

FIG. 10 illustrates a cross-sectional view 1000 of some embodiments of the image sensor of FIG. 1B in which the second semiconductor well 110 extends through the substrate 101 along sidewalls of the passivation structure 120.

The second semiconductor well 110 of the substrate 101 separates the passivation structure 120 from the first semiconductor well 108. In some embodiments where the second semiconductor well 110 has p-type doping, a passivation layer of the passivation structure 120 (e.g., the first passivation layer 302 in FIG. 3 or the second passivation layer in FIG. 4 or 5) has heavily doped p-type doping (e.g., p+ doping). In other words, in embodiments where the second semiconductor well 108 has p-type doping, a p-type dopant concentration of the passivation layer of the passivation structure 120 is greater than a p-type dopant concentration of the second semiconductor well 110.

FIGS. 11-21 illustrate cross-sectional views 1100-2100 of some embodiments of a method for forming an image sensor comprising a passivation structure extending along a substrate on opposite sides of a photodetector. Although FIGS. 11-21 are described in relation to a method, it will be appreciated that the structures disclosed in FIGS. 11-21 are not limited to such a method, but instead may stand alone as structures independent of the method.

Figure 11:
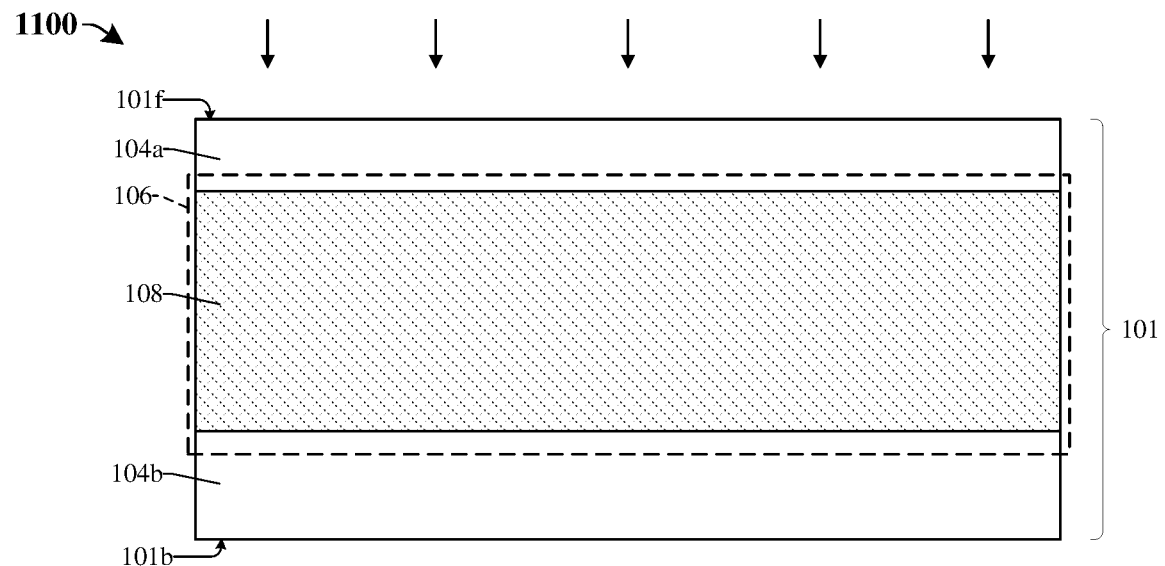
FIGS. 11-21 illustrate cross-sectional views of some embodiments of a method for forming an image sensor comprising a passivation structure extending along a substrate on opposite sides of a photodetector.

As shown in cross-sectional view 1100 of FIG. 11, a first semiconductor well 108 is formed within a substrate 101. In some embodiments, forming the first semiconductor well 108 in the substrate 101 forms a photodetector 106 in the substrate 101. In some embodiments, the first semiconductor well 108 may, for example, be formed by performing a first ion implantation process or some other suitable process along the frontside 101f of the substrate 101. In some embodiments, by performing a blanket implantation process without a mask (e.g., a photoresist mask) in place, a number of masks utilized to form the image sensor may be reduced.

Figure 12:
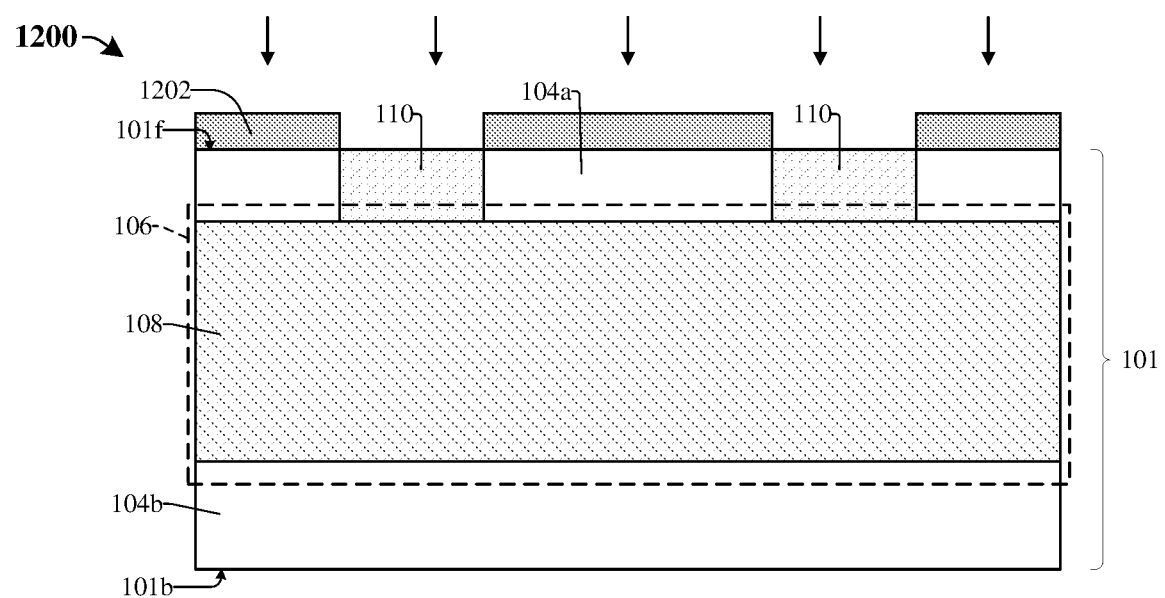

As shown in cross-sectional view 1200 of FIG. 12, a photoresist mask 1202 is formed over the frontside 101f of the substrate 101. A second semiconductor well 110 is then formed within the substrate 101 along the frontside 101f of the substrate 101 according to the photoresist mask 1202. In some embodiments, the second semiconductor well 110 may, for example, be formed by performing a second ion implantation process or some other suitable process along the frontside 101f of the substrate 101. In some embodiments, the photoresist mask 1202 may be removed after the second semiconductor well 110 is formed.

Figure 13:
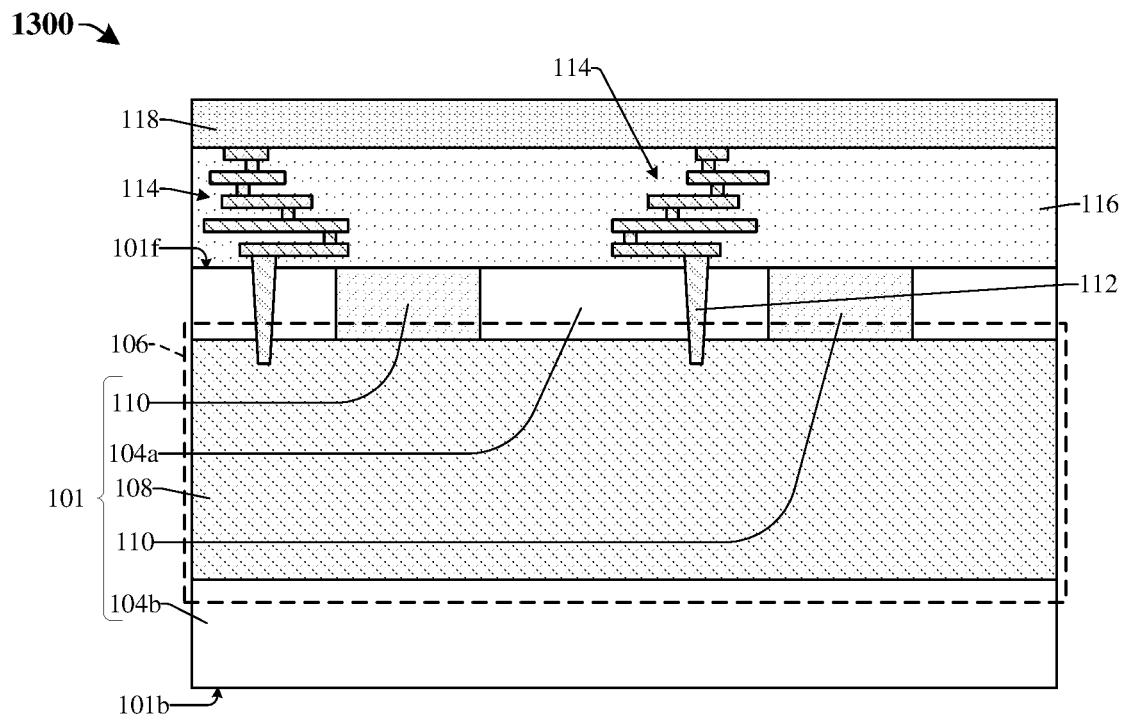

As shown in cross-sectional view 1300 of FIG. 13, a transfer gate 112 is formed along and/or within the substrate 101. Further, a dielectric structure 116 is formed over the substrate 101 and an interconnect structure 114 is formed within the dielectric structure 116. Furthermore, a carrier wafer 118 is bonded over the substrate 101. In some embodiments, the transfer gate 112 is formed by patterning the substrate 101 and by subsequently depositing a conductive material over the substrate 101. In some other embodiments, the transfer gate 112 is formed by depositing a conductive material over the substrate 101 and by subsequently patterning the conductive material. In some embodiments, the dielectric structure 116 is formed by depositing one or more dielectric layers and one or more etch stop layers over the substrate 101. In some embodiments, the interconnect structure is formed by patterning the dielectric structure 116 and by subsequently depositing one or more conductive materials over the dielectric structure 116.

Figure 14:
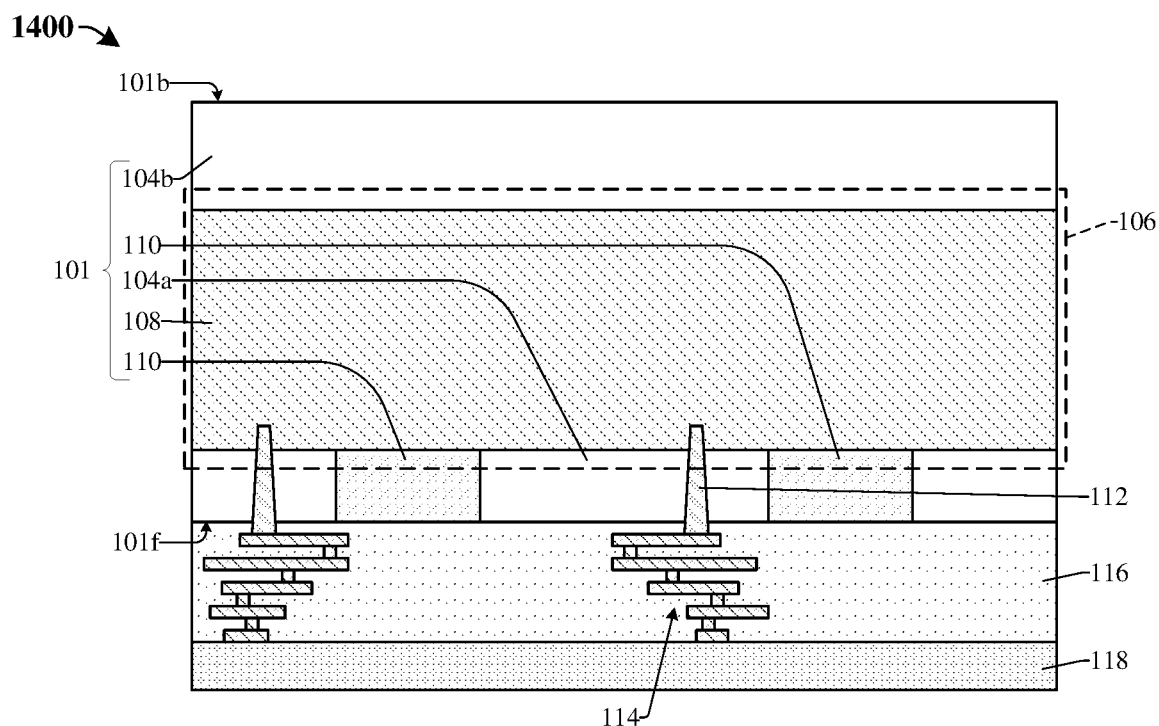

As shown in cross-sectional view 1400 of FIG. 14, the substrate 101 is rotated such that the backside 101b is over the frontside 101f.

Figure 15:
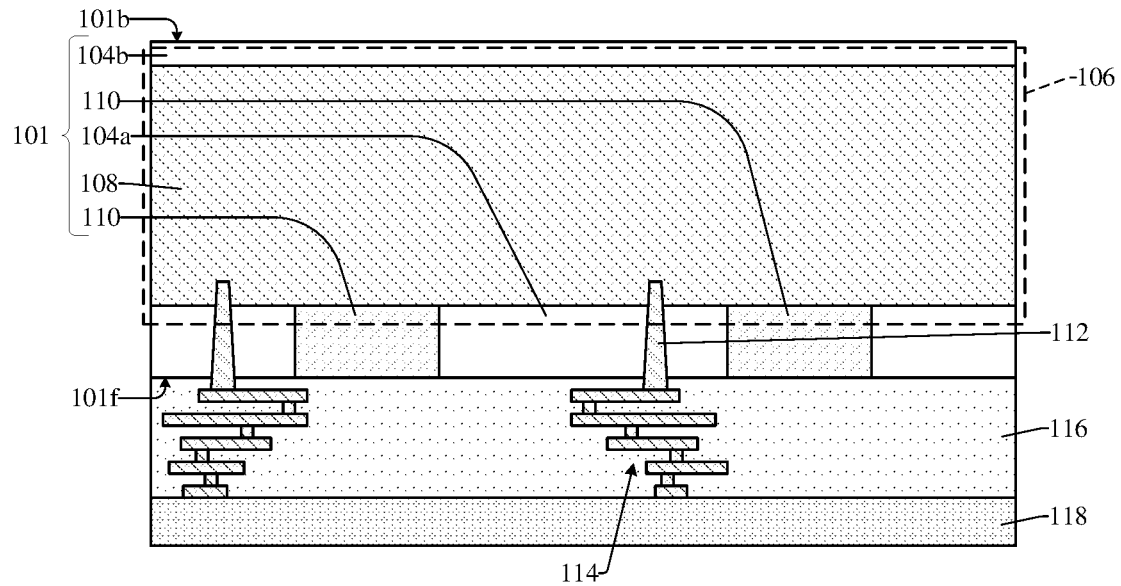

As shown in cross-sectional view 1500 of FIG. 15, the backside 101b of the substrate 101 is thinned. For example, a thickness of the substrate 101 is reduced by removing a portion of the substrate 101 from the backside 101b of the substrate 101. In some embodiments, the substrate 101 is thinned by an etching process, a planarization process (e.g., a chemical mechanical planarization (CMP) process), a grinding process, some other suitable process, of any combination of the foregoing.

Figure 16:
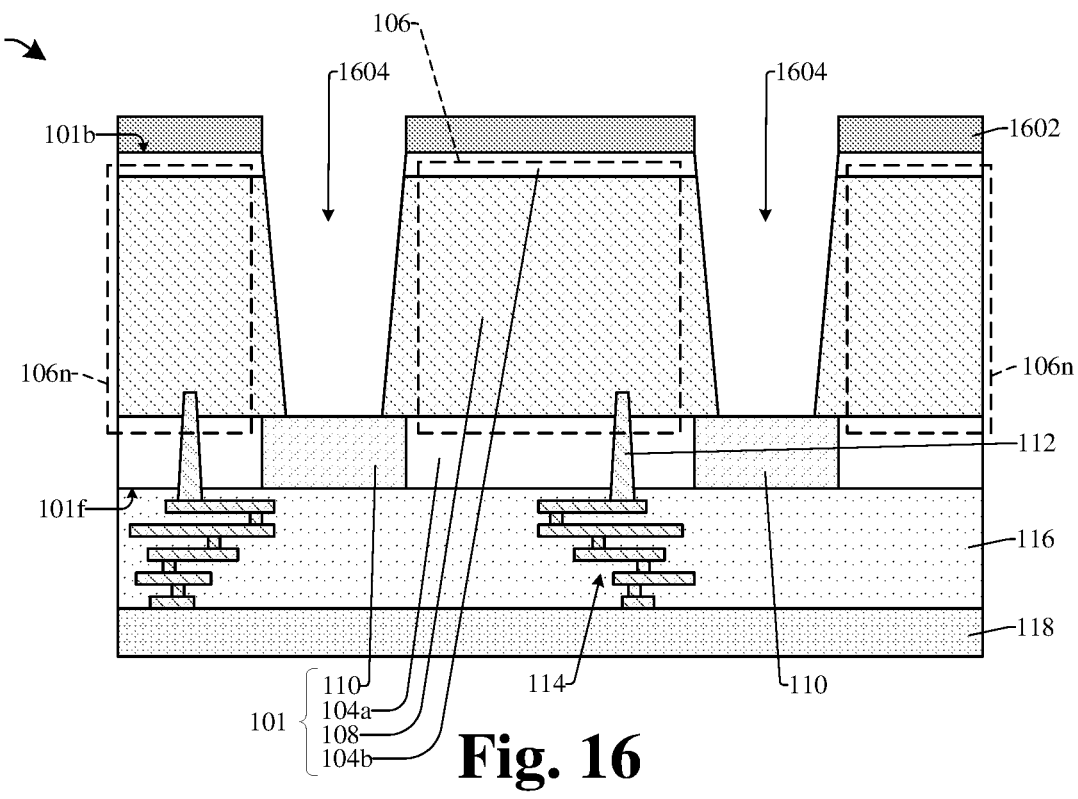

As shown in cross-sectional view 1600 of FIG. 16, a photoresist mask 1602 is formed over the backside 101b of the substrate 101. The substrate 101 is then patterned according to the photoresist mask 1602 to form a trench 1604 in the substrate 101. For example, the second region 104b of the substrate 101 and the first semiconductor well 108 of the substrate 101 are patterned according to the photoresist mask 1602. The trench 1604 is formed by sidewalls of the substrate 101 (e.g., sides of the second region 104b and sides of the first semiconductor well 108) and upper surfaces of the substrate 101 (e.g., tops of the second semiconductor well 110). The trench 1604 separates the photodetector 106 from neighboring photodetectors 106n. In some embodiments, the patterning may, for example, comprise a dry etching process or some other suitable process. For example, the patterning may comprise a reactive ion etching (RIE) process, an ion beam etching (IBE) process, or some other suitable process. In some embodiments, the photoresist mask 1602 may be removed after the patterning. In some embodiments, the patterning may extend into the second semiconductor well 110 and hence the trench 1604 extends into the second semiconductor well 110 below a top of the second semiconductor well (e.g., as shown in FIG. 8).

Figure 17A:
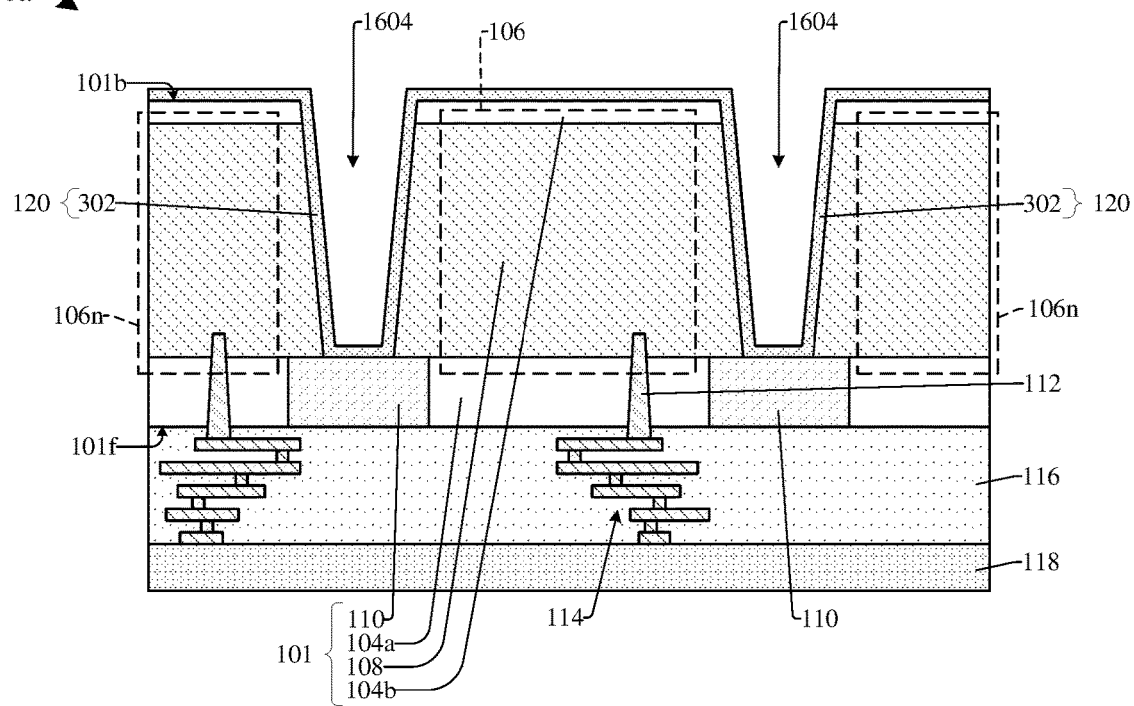
Figure 17B:
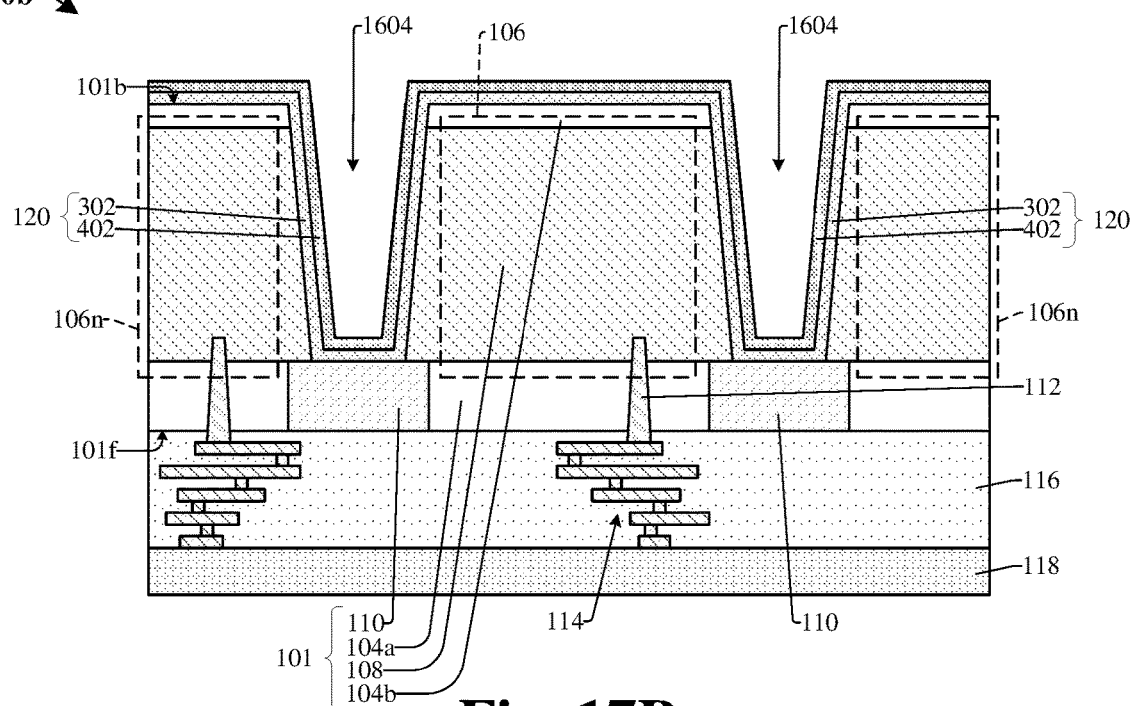
Figure 17C:
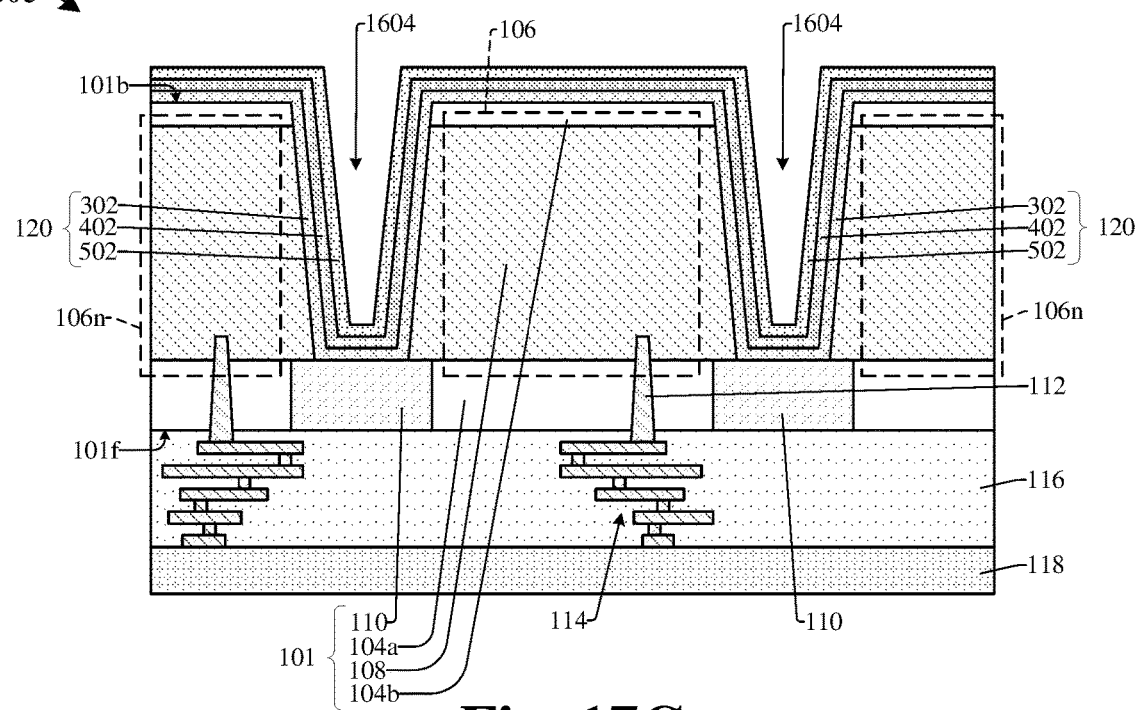

Cross-sectional views 1700a, 1700b, and 1700c of FIGS. 17A, 17B, and 17C, respectively, illustrate some embodiments of methods for forming the passivation structure 120 over the substrate and in the trench 1604 (e.g., along the sidewalls and upper surfaces of the substrate 101 that form the trench 1604). For example, cross-sectional view 1700a of FIG. 17A illustrates a first embodiment of a method for forming the passivation structure 120, cross-sectional view 1700b of FIG. 17B illustrates a second embodiment of a method for forming the passivation structure 120, and cross-sectional view 1700c of FIG. 17C illustrates a third embodiment of a method for forming the passivation structure 120.

As shown in cross-sectional view 1700a of FIG. 17A, a first passivation layer 302 is conformally formed over the substrate and in the trench 1604. In some embodiments, forming the first passivation layer 302 comprises depositing p-type hydrogenated amorphous silicon or some other suitable material over the substrate 101 by a chemical vapor deposition (CVD) process, an atomic layer deposition (ALD) process, a plasma-enhanced CVD (PECVD) process, a plasma enhanced ALD (PEALD) process, or the like.

As shown in cross-sectional view 1700b of FIG. 17B, a first passivation layer 302 is conformally formed over the substrate 101 and in the trench 1604, and a second passivation layer 402 is conformally formed over the first passivation layer 302. In some embodiments, forming the first passivation layer 302 comprises depositing intrinsic hydrogenated amorphous silicon, p-type hydrogenated amorphous silicon, or some other suitable material over the substrate 101 by a CVD process, an ALD process, a PECVD process, a PEALD process, or the like. In some embodiments, forming the second passivation layer 402 comprises depositing p-type hydrogenated amorphous silicon, aluminum oxide, or some other suitable material over the substrate 101 by a CVD process, an ALD process, a PECVD process, a PEALD process, or the like.

As shown in cross-sectional view 1700c of FIG. 17C, a first passivation layer 302 is conformally formed over the substrate 101 and in the trench 1604, a second passivation layer 402 is conformally formed over the first passivation layer 302, and a third passivation layer 502 is conformally formed over the second passivation layer 402. In some embodiments, forming the first passivation layer 302 comprises depositing intrinsic hydrogenated amorphous silicon or some other suitable material over the substrate 101 by a CVD process, an ALD process, a PECVD process, a PEALD process, or the like. In some embodiments, forming the second passivation layer 402 comprises depositing p-type hydrogenated amorphous silicon or some other suitable material over the substrate 101 by a CVD process, an ALD process, a PECVD process, a PEALD process, or the like. In some embodiments, forming the third passivation layer 502 comprises depositing aluminum oxide or some other suitable material over the substrate 101 by a CVD process, an ALD process, a PECVD process, a PEALD process, or the like.

In the embodiments illustrated in FIGS. 17A, 17B, and 17C, a dopant concentration of the p-type hydrogenated amorphous silicon may be controlled by adjusting an amount of boron gas, aluminum gas, gallium gas, or some other suitable dopant gas used during the deposition of the p-type hydrogenated amorphous silicon. The dopant concentration of the p-type hydrogenated amorphous silicon layer(s) may be about $10^{14}$ cm$^{-3}$ to $10^{21}$ cm$^{-3}$. Further, in the embodiments of FIGS. 17A, 17B, and 17C, a hydrogen concentration of the hydrogenated amorphous silicon may be controlled by controlling an amount of hydrogen gas used during the deposition of the hydrogenated amorphous silicon. In some embodiments, the hydrogen concentration may be further controller by controlling a temperature of the CVD process, by controlling a plasma power of the PECVD process, and/or by controlling a plasma power of the PEALD process. For example, if a CVD process is used, lowering the temperature of the CVD process may increase the hydrogen concentration of the hydrogenated amorphous silicon layer(s). If a PECVD process or a PEALD process is used, increasing the plasma power of the PECVD or PEALD process may increase the hydrogen concentration of the hydrogenated amorphous silicon layer(s). The hydrogen concentration of the hydrogenated amorphous silicon layer(s) may be about 4% to 35%.

Figure 18:
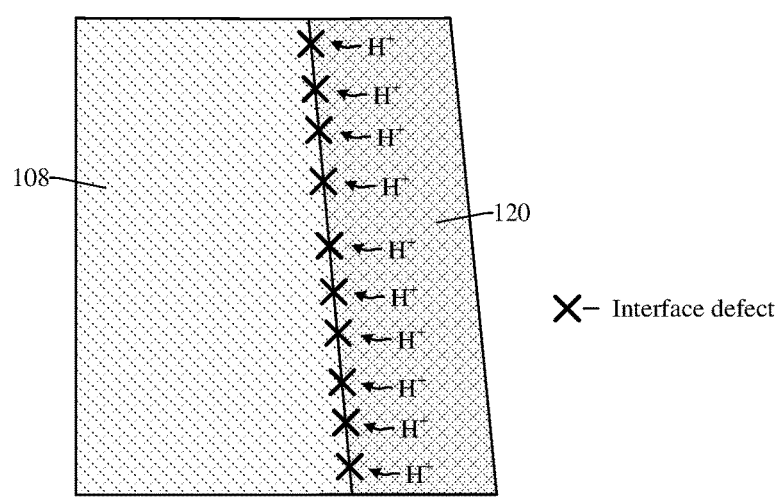

As shown in cross-sectional view 1800 of FIG. 18, the passivation structure 120 is annealed. For example, the passivation structure 120 may be heated (e.g., in a furnace) at a temperature of less than about 250 degrees Celsius. Annealing the passivation structure 120 may increase the number of hydrogen ions that are provided to the interface to passivate the interface. For example, annealing the passivation structure 120 may release hydrogen ions from the passivation structure 120, and the released hydrogen ions may passivate defects along the interface (e.g., the hydrogen ions may fill interface traps or the like along the interface, thereby passivating the interface).

Figure 19:
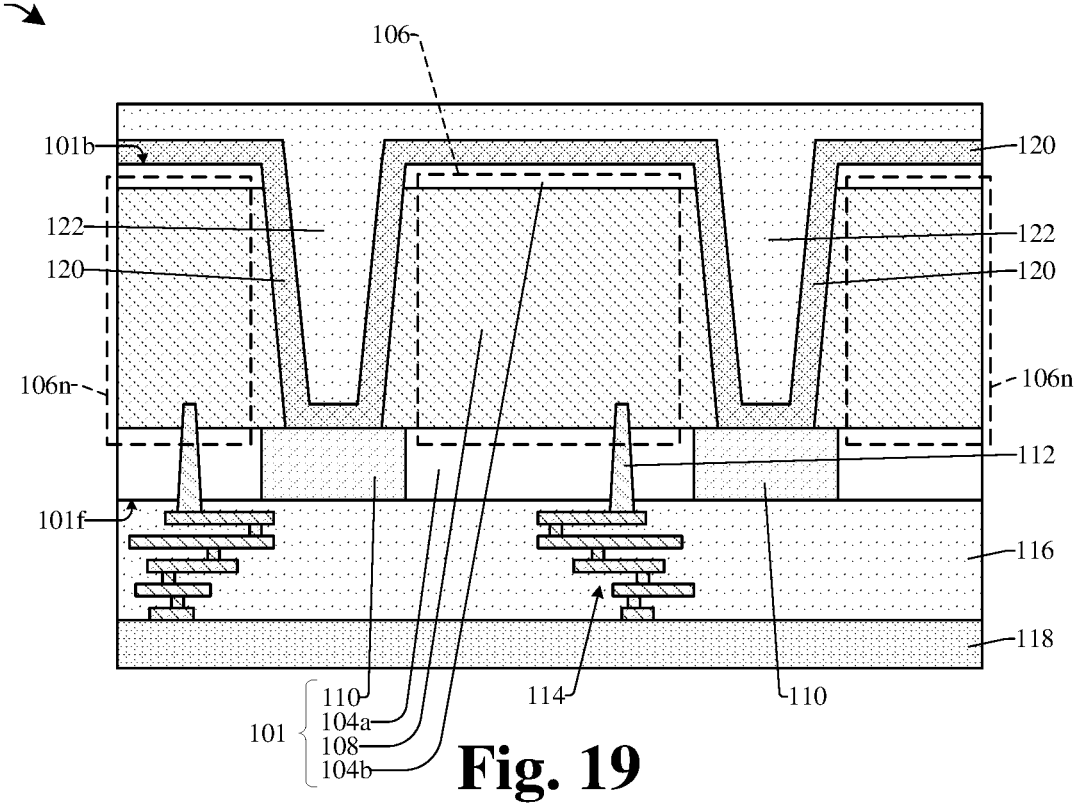

As shown in cross-sectional view 1900 of FIG. 19, a trench isolation structure 122 is formed over the substrate 101 and in a remainder of the trench (e.g., 1604 of FIGS. 17A-17C). In some embodiments, forming the trench isolation structure 122 comprises depositing one or more dielectric layers over the substrate 101 and in the remainder of the trench by a CVD process, a PECVD process, or some other suitable deposition process. For example, the one or more dielectric layers may comprise silicon dioxide, silicon nitride, or some other suitable dielectric material(s).

Although FIG. 18 illustrates the anneal process as being performed after the formation of the passivation structure 120 and before the formation of the trench isolation structure 122, it will be appreciated that in some alternative embodiments, the anneal process may optionally be performed after the formation of the trench isolation structure 122.

As shown in cross-sectional view 2000 of FIG. 20, a portion of the trench isolation structure 122 and a portion of the passivation structure 120 are removed from over the substrate 101 (e.g., from along the backside 101b of the substrate 101). As a result, the backside 101b of the substrate 101 is uncovered after the removal. In some embodiments, the portion of the trench isolation structure 122 and the portion of the passivation structure 120 are removed from over the substrate 101 by performing a planarization process (e.g., a CMP process), an etching process, some other suitable process, or any combination of the foregoing on the trench isolation structure 122 and the passivation structure 120.

In some embodiments, the passivation structure 120 may not be entirely removed from the backside 101b of the substrate 101 such that the passivation structure 120 remains on the backside 101b of substrate 101 after the planarization process, the etching process, or the like (e.g., as shown in FIG. 7).

Figure 21:
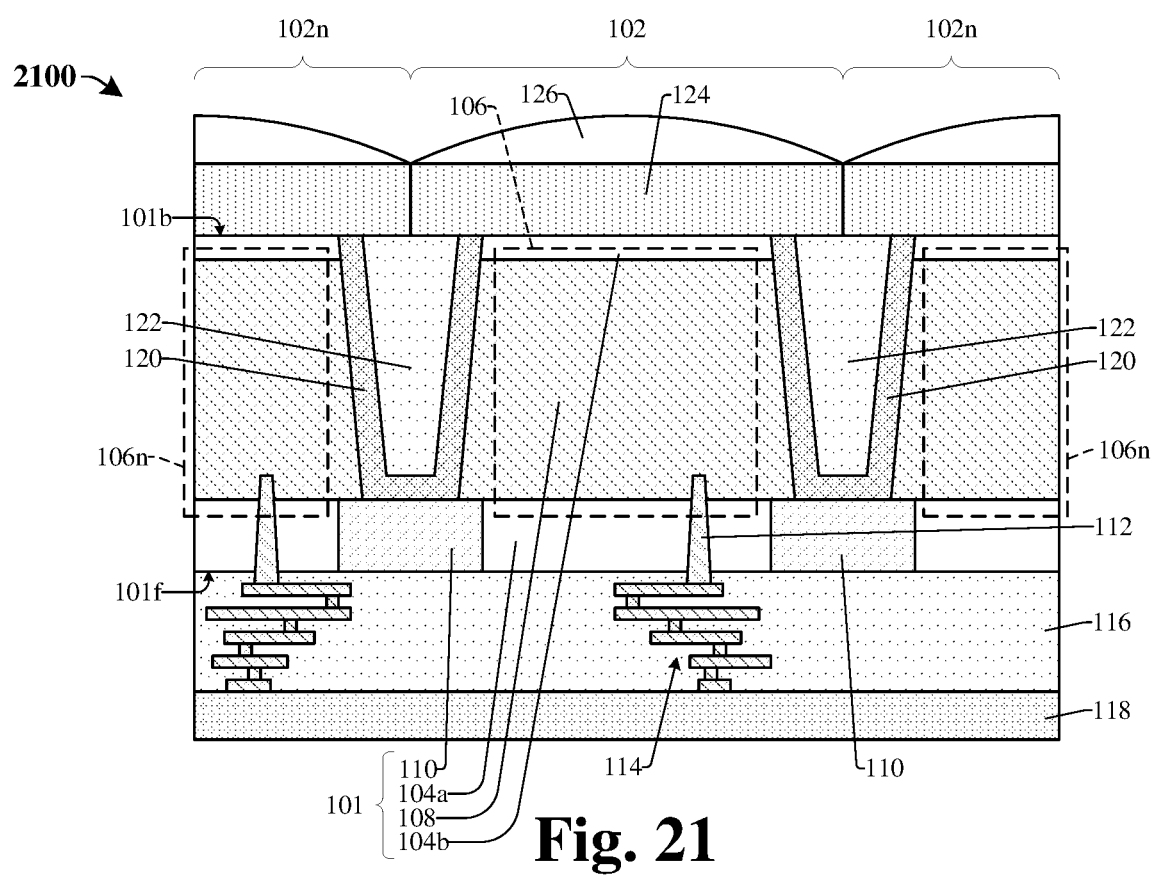

As shown in cross-sectional view 2100 of FIG. 21, a color filter 124 and a lens 126 are formed over the backside 101b of the substrate 101.

FIGS. 22-27 illustrate cross-sectional views 2200-2700 of some alternative embodiments of a method for forming an image sensor comprising a passivation structure extending along a substrate on opposite sides of a photodetector. Although FIGS. 22-27 are described in relation to a method, it will be appreciated that the structures disclosed in FIGS. 22-27 are not limited to such a method, but instead may stand alone as structures independent of the method.

In some embodiments of the method, a first semiconductor well 108 is formed within a substrate 101 (e.g., as described with regard to FIG. 11). A second semiconductor well 110 is formed within the substrate 101 (e.g., as described with regard to FIG. 12). A transfer gate 112 is formed along and/or within the substrate 101, a dielectric structure 116 is formed over the substrate 101, an interconnect structure 114 is formed within the dielectric structure 116, and a carrier wafer 118 is bonded over the substrate 101 (e.g., as described with regard to FIG. 13). The substrate 101 is rotated (e.g., as described with regard to FIG. 14). The backside 101b of the substrate 101 is thinned (e.g., as described with regard to FIG. 15).

Figure 22:
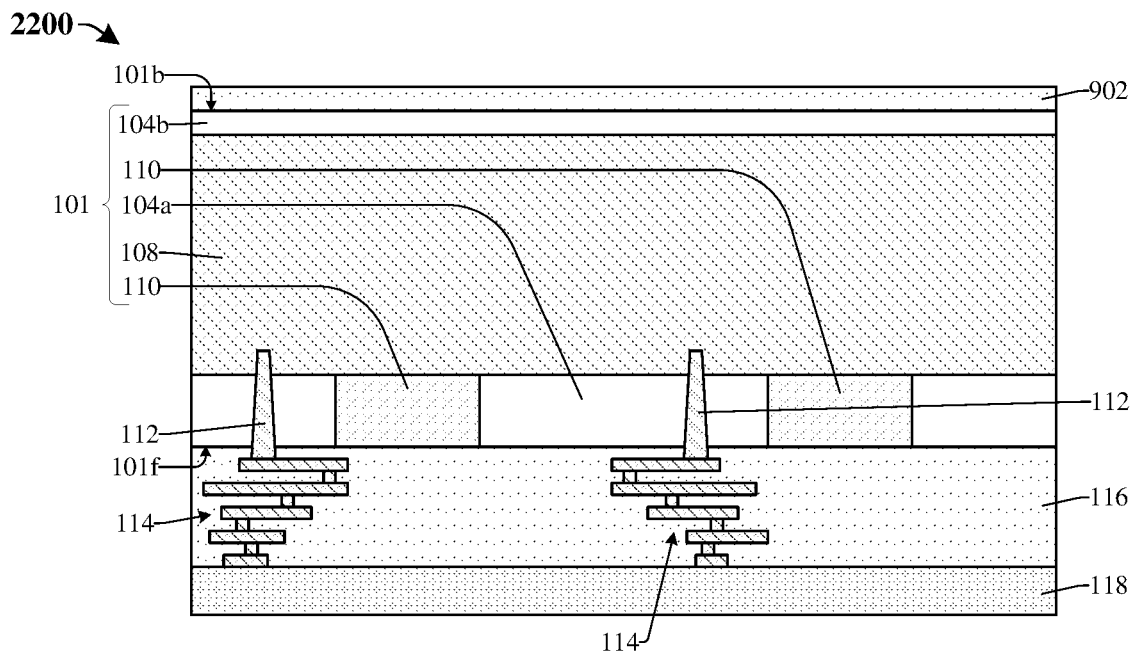
FIGS. 22-27 illustrate cross-sectional views of some alternative embodiments of a method for forming an image sensor comprising a passivation structure extending along a substrate on opposite sides of a photodetector.

As shown in cross-sectional view 2200 of FIG. 22, a dielectric layer 902 is formed over the substrate 101 along the backside 101b of the substrate 101. In some embodiments, the dielectric layer 902 is formed by depositing silicon dioxide, silicon nitride, or some other suitable material over the substrate 101 by a CVD process, a PECVD process, or some other suitable process.

Figure 23:
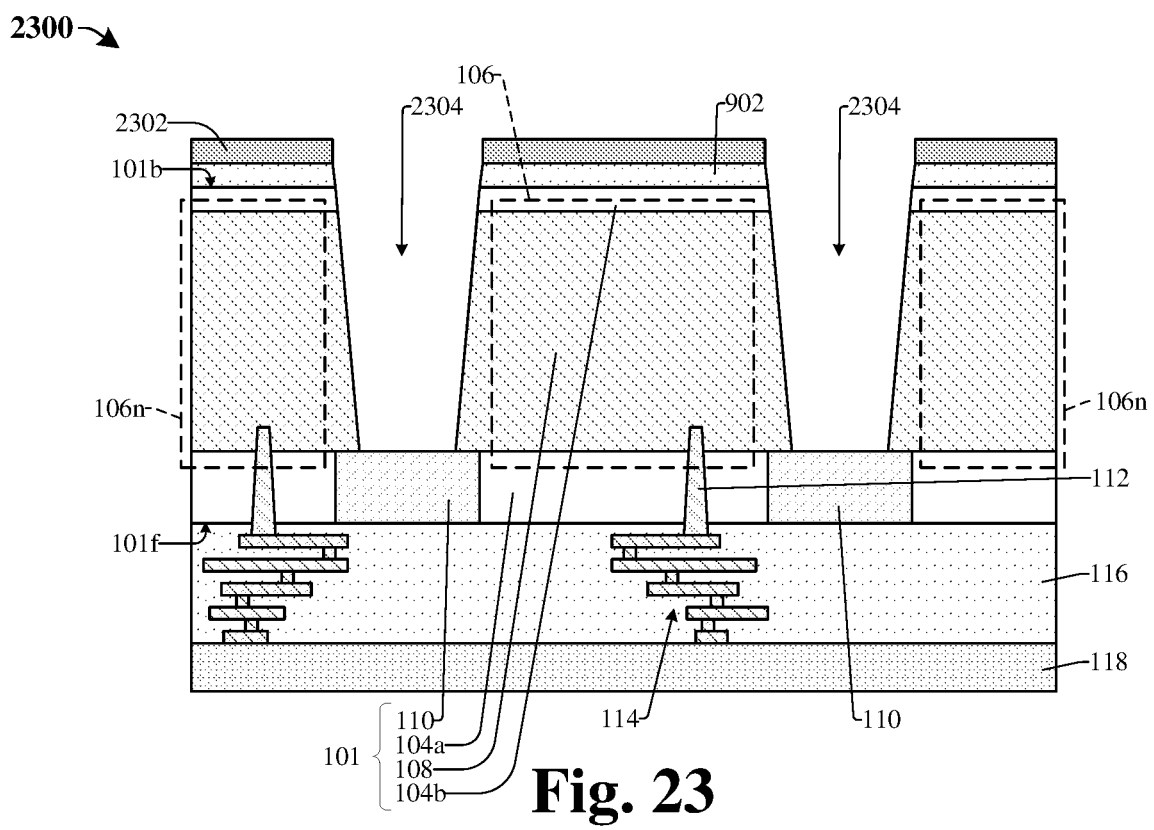

As shown in cross-sectional view 2300 of FIG. 23, a photoresist mask 2302 is formed over the substrate 101. The dielectric layer 902 and the substrate 101 (e.g., the second region 104b of the substrate 101 and the first semiconductor well 108 of the substrate 101) are then patterned according to the photoresist mask 2302 to form a trench 2304 in the dielectric layer 902 and in the substrate 101. In some embodiments, the patterning may, for example, comprise a dry etching process or some other suitable process. For example, the patterning may comprise a reactive ion etching (RIE) process, an ion beam etching (IBE) process, or some other suitable process. In some embodiments, the photoresist mask 2302 may be removed after the patterning.

Figure 24:
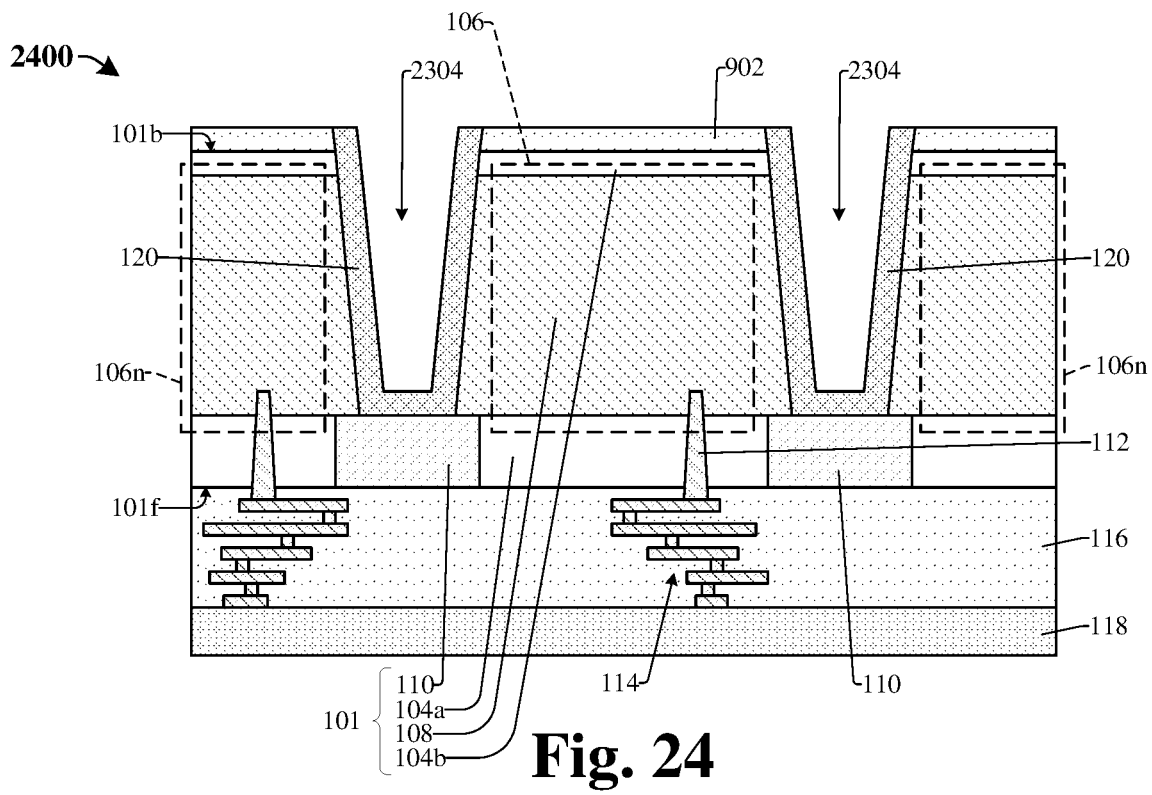

As shown in cross-sectional view 2400 of FIG. 24, a passivation structure 120 is formed on sidewalls and upper surfaces of the substrate 101 (e.g., on sides of the first semiconductor well 108 and on tops of the second semiconductor well 110 of the substrate 101) that form the trench 2304, but is not formed over the dielectric layer 902. For example, the passivation structure 120 is formed by an epitaxial growth deposition process where the passivation structure 120 is grown on the sidewalls and the upper surfaces of the substrate 101 that form the trench 2304, but is not grown on a top surface of the dielectric layer 902. In some embodiments, the passivation structure 120 is also grown on sidewalls of the dielectric layer 902 that form the trench 2304.

In some embodiments, a first passivation layer (e.g., 302 of FIG. 3) comprising p-type hydrogenated amorphous silicon is grown on the sidewalls and the upper surfaces of the substrate that form the trench 2304. In some alternative embodiments, a first passivation layer (e.g., 302 of FIG. 4) comprising intrinsic hydrogenated amorphous silicon is grown on the sidewalls and the upper surfaces of the substrate that form the trench 2304, and a second passivation layer (e.g., 402 of FIG. 4) comprising p-type hydrogenated amorphous silicon is grown on the first passivation layer (e.g., on sidewalls and upper surfaces of the first passivation layer). In some alternative embodiments, a first passivation layer (e.g., 302 of FIG. 5) comprising intrinsic hydrogenated amorphous silicon is grown on the sidewalls and the upper surfaces of the substrate that form the trench 2304, a second passivation layer (e.g., 402 of FIG. 5) comprising p-type hydrogenated amorphous silicon is grown on the first passivation layer (e.g., on sidewalls and upper surfaces of the first passivation layer), and a third passivation layer (e.g., 502 of FIG. 5) comprising aluminum oxide is grown on the second passivation layer (e.g., on sidewalls and upper surfaces of the second passivation layer). In some embodiments, an anneal process (e.g., as described with regard to FIG. 18) is performed after the passivation structure 120 is formed.

Figure 25:
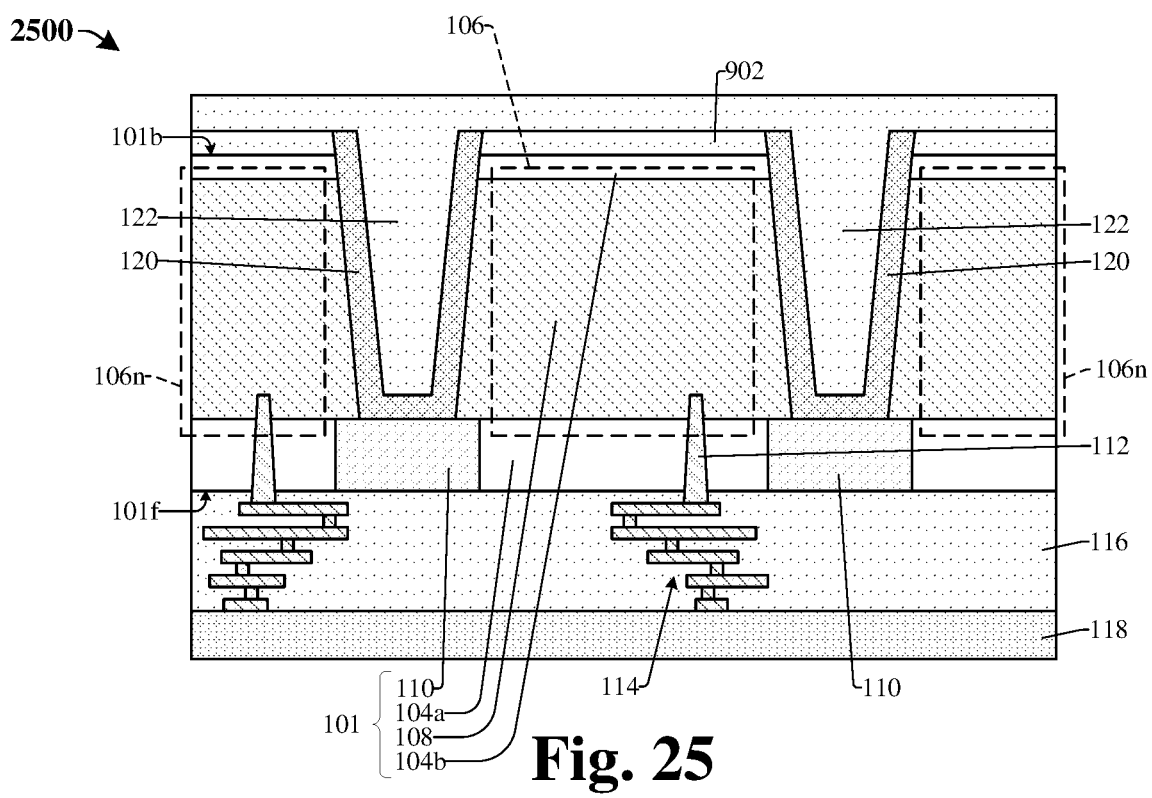
Figure 27:
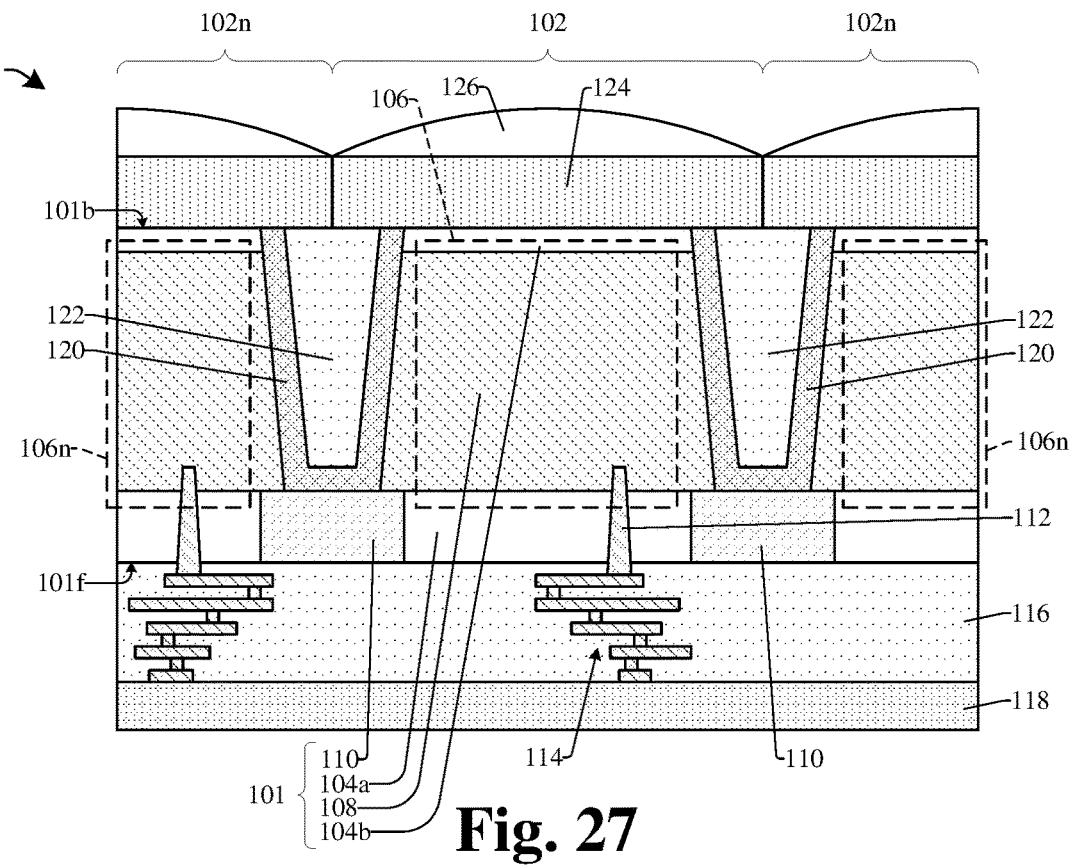

As shown in cross-sectional views 2500, 2600, and 2700 of FIGS. 25, 26, and 27, a trench isolation structure 122 is formed in a remainder of the trench 2304 (e.g., as described with regard to FIG. 19). Then, a portion of the trench isolation structure 122 and the dielectric layer 902 are removed from over the substrate 101 (e.g., as described with regard to FIG. 20). Then, a color filter 124 and lens 126 are formed over the substrate 101 (e.g., as described with regard to FIG. 21). In some embodiments, the dielectric layer 902 is not entirely removed from the backside 101*b* of the substrate 101 such that some of the dielectric layer 902 remains after over the substrate 101 after the removal process (e.g., as shown in FIG. 9).

Figure 28:
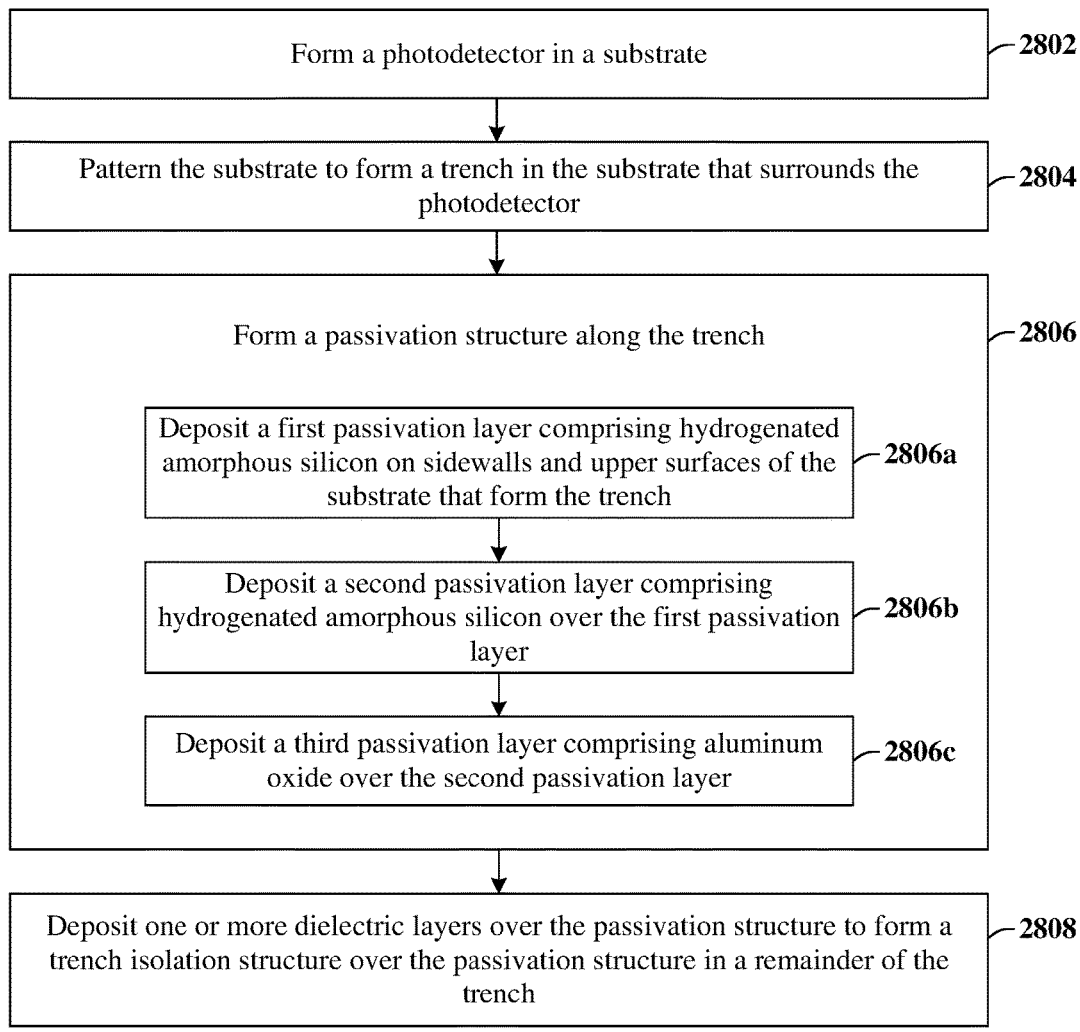
FIG. 28 illustrates a flow diagram of some embodiments of a method for forming an image sensor comprising a passivation structure extending along a substrate on opposite sides of a photodetector.

FIG. 28 illustrates a flow diagram of some embodiments of a method 2800 for forming an image sensor comprising a passivation structure extending along a substrate on opposite sides of a photodetector. While method 2800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2802, a photodetector is formed in a substrate. FIG. 11 illustrates a cross-sectional view 1100 of some embodiments corresponding to block 2802.

At 2804, the substrate is patterned to form a trench in the substrate that surrounds the photodetector. FIG. 16 and FIG. 23 illustrate cross-sectional views 1600 and 2300 of some embodiments corresponding to block 2804.

At 2806, a passivation structure is formed along the trench. For example, at 2806*a*, a first passivation layer comprising hydrogenated amorphous silicon is deposited on sidewalls and upper surfaces of the substrate that form the trench. At 2806*b*, a second passivation layer comprising hydrogenated amorphous silicon is deposited over the first passivation layer. At 2806*c*, a third passivation layer comprising aluminum oxide is deposited over the second passivation layer. FIGS. 17A, 17B, 17C, and 24 illustrate cross-sectional views 1700*a*, 1700*b*, 1700*c*, and 2400 of some embodiments corresponding to blocks 2806, 2806*a*, 2806*b*, and 2806*c*. In some examples, a low temperature anneal (e.g., 250 degrees Celsius or less) is performed after the passivation structure is formed.

At 2808, one or more dielectric layers are deposited over the passivation structure to form a trench isolation structure over the passivation structure in a remainder of the trench. FIG. 19 and FIG. 25 illustrate cross-sectional views 1900 and 2500 of some embodiments corresponding to block 2808.

Thus, the present disclosure relates to an image sensor and a method for forming the image sensor, the image sensor comprising a substrate and one or more passivation layers along the substrate for improving a passivation of the substrate.

Accordingly, in some embodiments, the present disclosure relates to an integrated chip comprising a substrate. A photodetector is arranged within the substrate. A trench isolation structure extends into the substrate on opposite sides of the photodetector. The trench isolation structure separates the photodetector from neighboring photodetectors. A first passivation layer is between a sidewall of the substrate and a sidewall of the trench isolation structure. The first passivation layer comprises hydrogenated amorphous silicon.

In other embodiments, the present disclosure relates to an integrated chip comprising a substrate. A first semiconductor well is within the substrate. The first semiconductor well forms a photodetector within the substrate. A trench isolation structure extends into the first semiconductor well on opposite sides of the photodetector. The trench isolation structure separates the photodetector from neighboring photodetectors. A passivation structure is between the first semiconductor well and the trench isolation structure. The first semiconductor well is on a sidewall of the passivation structure. The passivation structure is on a sidewall of the trench isolation structure. The passivation structure comprises hydrogenated amorphous silicon.

In yet other embodiments, the present disclosure relates to a method for forming an integrated chip. The method comprises forming a photodetector in a substrate. The substrate is patterned to form a trench in the substrate. The trench is formed by sidewalls of the substrate and the trench surrounds the photodetector. A first passivation layer is deposited on the sidewalls of the substrate that form the trench. The first passivation layer comprises hydrogenated amorphous silicon. A dielectric layer is deposited over the first passivation layer and in a remainder of the trench to form a trench isolation structure over the first passivation layer and surrounding the photodetector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
   forming a photodetector in a substrate;
   patterning the substrate to form a trench in the substrate, wherein the trench is formed by sidewalls of the substrate, and wherein the trench surrounds the photodetector;
   depositing a first passivation layer on the sidewalls of the substrate that form the trench, the first passivation layer comprising hydrogenated amorphous silicon; and
   depositing a dielectric layer over the first passivation layer and in a remainder of the trench to form a trench isolation structure over the first passivation layer and surrounding the photodetector.

2. The method of claim 1, wherein the hydrogenated amorphous silicon of the first passivation layer is undoped, and wherein the method further comprises:
   depositing a second passivation layer over the first passivation layer, the second passivation layer comprising hydrogenated amorphous silicon that has p-type doping.

3. The method of claim 2, further comprising:
   depositing a third passivation layer over the second passivation layer, the third passivation layer comprising aluminum oxide.

4. The method of claim 2, further comprising:
   annealing the first passivation layer at a temperature of less than 250 degrees Celsius.

5. The method of claim 2, wherein the first passivation layer is deposited along a backside of the substrate, wherein the dielectric layer is deposited along the backside of the substrate, and wherein the method further comprises:
   performing a planarization process on the dielectric layer and the first passivation layer to remove the dielectric layer and the first passivation layer from along the backside of the substrate.

6. The method of claim 1, wherein the substrate has a n-type doping type along the sidewalls of the substrate, and wherein the hydrogenated amorphous silicon has p-type doping.

7. The method of claim 1, wherein the substrate has p-type doping along the sidewalls of the substrate, wherein the hydrogenated amorphous silicon has p-type doping, and wherein a dopant concentration of the hydrogenated amorphous silicon is greater than a dopant concentration of the substrate along the sidewalls of the substrate.

8. The method of claim 1, wherein a hydrogen concentration of the hydrogenated amorphous silicon ranges from 4% to 35%.

9. A method for forming an integrated chip, the method comprising:
   forming a photodetector in a substrate;
   etching the substrate to form a trench in the substrate, wherein the trench surrounds the photodetector and the trench is delimited by sidewalls of the substrate;
   forming a passivation structure along the sidewalls of the substrate, the passivation structure comprising hydrogenated amorphous silicon having p-type doping; and
   depositing a dielectric layer over of the passivation structure to from a trench isolation structure in the trench, wherein the trench isolation structure is separated from the substrate by the passivation structure.

10. The method of claim 9, wherein forming the passivation structure comprises depositing a first passivation layer on the sidewalls of the substrate, the first passivation layer comprising the hydrogenated amorphous silicon having the p-type doping, and wherein the dielectric layer is deposited on the first passivation layer.

11. The method of claim 9, wherein forming the passivation structure comprises depositing a first passivation layer on the sidewalls of the substrate and depositing a second passivation layer over the first passivation layer, the first passivation layer comprising hydrogenated amorphous silicon having intrinsic doping and the second passivation layer comprising the hydrogenated amorphous silicon having the p-type doping, and wherein the dielectric layer is deposited on the second passivation layer.

12. The method of claim 9, wherein forming the passivation structure comprises depositing a first passivation layer on the sidewalls of the substrate, depositing a second passivation layer over the first passivation layer, and depositing a third passivation layer over the second passivation layer, the first passivation layer comprising hydrogenated amorphous silicon having intrinsic doping, the second passivation layer comprising the hydrogenated amorphous silicon having the p-type doping, and the third passivation layer comprising aluminum oxide, and wherein the dielectric layer is deposited on the third passivation layer.

13. The method of claim 9, wherein the substrate has n-type doping along the sidewalls of the substrate.

14. The method of claim 9, wherein the substrate has p-type doping along the sidewalls of the substrate, and wherein a dopant concentration of the hydrogenated amorphous silicon is greater than a dopant concentration of the substrate at along the sidewalls of the substrate.

15. The method of claim 9, wherein forming the photodetector in the substrate comprises forming a first semiconductor well having a first doping type in a substrate along a first side of the substrate, the method further comprising:
   forming second semiconductor well having a second doping type, different than the first doping type, in the substrate along a second side of the substrate, opposite the first side,
   wherein the first semiconductor well extends along sidewalls of the passivation structure, and wherein the second semiconductor well extends along a bottom surface of the passivation structure.

16. A method for forming an integrated chip, the method comprising:
   forming a first semiconductor well having a first doping type in a substrate along a first side of the substrate;

forming second semiconductor well having a second doping type, different than the first doping type, in the substrate along a second side of the substrate, opposite the first side;

etching the first side of the substrate to form a trench in the substrate, wherein the trench surrounds a photodetector in the first semiconductor well, wherein the trench is delimited by sidewalls of the substrate and an upper surface of the substrate, and wherein the first semiconductor well extends along the sidewalls of the substrate and the second semiconductor well extends along the upper surface of the substrate;

depositing a first passivation layer on the sidewalls of the substrate and the upper surface of the substrate, the first passivation layer comprising hydrogenated amorphous silicon; and depositing a dielectric layer over sidewalls and an upper surface of the first passivation layer to form a trench isolation structure surrounding the photodetector.

17. The method of claim 16, wherein a hydrogen concentration of the hydrogenated amorphous silicon is controlled during the depositing of the first passivation layer by controlling an amount of hydrogen gas used during the depositing of the first passivation layer.

18. The method of claim 16, wherein the hydrogenated amorphous silicon has p-type doping, and wherein a dopant concentration of the hydrogenated amorphous silicon is controlled during the depositing of the first passivation layer by controlling an amount dopant gas used during the depositing of the first passivation layer.

19. The method of claim 16, further comprising:

depositing a second passivation layer on the sidewalls and the upper surface of the first passivation layer, wherein the first passivation layer comprises intrinsic hydrogenated amorphous silicon and the second passivation layer comprises hydrogenated amorphous silicon having p-type doping, and wherein the dielectric layer is deposited over sidewalls and an upper surface of the second passivation layer.

20. The method of claim 19, further comprising:

depositing a third passivation layer on the sidewalls and the upper surface of the second passivation layer, wherein the third passivation layer comprises aluminum oxide, and wherein the dielectric layer is deposited over sidewalls and an upper surface of the third passivation layer.

* * * * *